US011468946B2

(12) United States Patent
Okawa et al.

(10) Patent No.: US 11,468,946 B2
(45) Date of Patent: Oct. 11, 2022

(54) SEMICONDUCTOR STORAGE DEVICE

(71) Applicant: Kioxia Corporation, Tokyo (JP)

(72) Inventors: Kazuki Okawa, Yokohama (JP);
Hiroyuki Hara, Fujisawa (JP); Atsushi
Kawasumi, Fujisawa (JP)

(73) Assignee: Kioxia Corporation, Tokyo (JP)

( * ) Notice: Subject to any disclaimer, the term of this
patent is extended or adjusted under 35
U.S.C. 154(b) by 0 days.

(21) Appl. No.: 17/345,208

(22) Filed: Jun. 11, 2021

(65) Prior Publication Data
US 2022/0084588 A1    Mar. 17, 2022

(30) Foreign Application Priority Data
Sep. 17, 2020 (JP) .............................. JP2020-156715

(51) Int. Cl.
G11C 11/00 (2006.01)
G11C 13/00 (2006.01)
H03K 19/173 (2006.01)
G11C 5/06 (2006.01)

(52) U.S. Cl.
CPC .............. G11C 13/004 (2013.01); G11C 5/06
(2013.01); G11C 13/0026 (2013.01); G11C
13/0028 (2013.01); G11C 13/0069 (2013.01);
H03K 19/1737 (2013.01)

(58) Field of Classification Search
CPC .............. G11C 13/004; G11C 13/0026; G11C
13/0028; G11C 13/0069
USPC ......................................................... 365/148
See application file for complete search history.

(56) References Cited

U.S. PATENT DOCUMENTS

2016/0276571 A1*  9/2016 Tanaka ................ H01L 41/0475
2018/0076983 A1   3/2018 Yamamoto et al.
2019/0050169 A1   2/2019 Komai
2022/0045129 A1   2/2022 Hara et al.

FOREIGN PATENT DOCUMENTS

JP      2018-045743 A     3/2018
JP      2022-30299 A      2/2022

* cited by examiner

Primary Examiner — Vu A Le
(74) Attorney, Agent, or Firm — Oblon, McClelland,
Maier & Neustadt, L.L.P.

(57) ABSTRACT

Provided is a semiconductor storage device including: a substrate having a substrate surface extending in a first direction and a second direction intersecting the first direction; a plurality of first region memory cells provided in a plurality of layers provided parallel to the substrate surface and in a third direction, the first region memory cells being provided above a rectangular shaped first region provided on the substrate surface, the first region having a first side parallel to the first direction and a second side parallel to the second direction when viewed from the third direction intersecting the first direction and the second direction; a plurality of first region wirings provided between the first region memory cells; a plurality of second region memory cells provided in the layers, the second region memory cells being provided above a rectangular shaped second region having a third side parallel to the first direction and a fourth side parallel to the second direction when viewed from the third direction; a plurality of second region wirings provided between the second region memory cells; and a control circuit capable of executing a reading operation.

10 Claims, 18 Drawing Sheets

SEMICONDUCTOR STORAGE DEVICE

CROSS-REFERENCE TO RELATED APPLICATION

This application is based upon and claims the benefit of priority from Japanese Patent Application No. 2020-156715, filed on Sep. 17, 2020, the entire contents of which are incorporated herein by reference.

FIELD

Embodiments described herein relate generally to semiconductor storage devices.

BACKGROUND

A cross-point type memory device that uses a variable resistance element as a memory cell array has attracted attention as a device that can easily realize a large-capacity storage device as compared with a storage device in the related art.

In the cross-point type memory device, a large number of wirings called bit lines and word lines are cross-arranged, and memory cells are formed at intersections of the bit lines and the word lines. Writing in one memory cell is performed by applying a voltage or current to the bit lines and the word lines connected to the cell.

DETAILED DESCRIPTION

Figure 1:
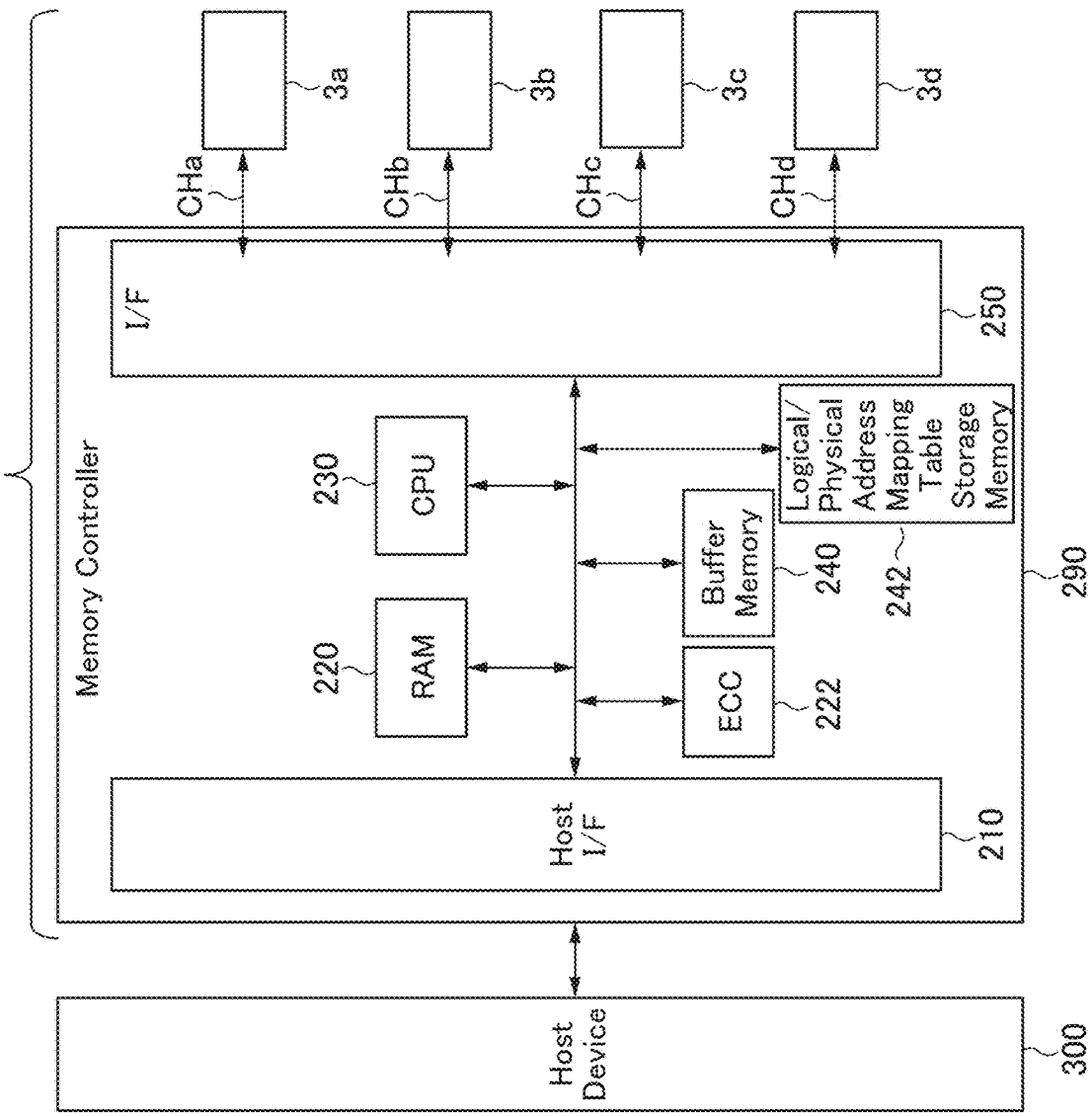
FIG. 1 is a block diagram illustrating a configuration of a semiconductor storage device according to a first embodiment.

Hereinafter, embodiments will be described with reference to the drawings. In addition, in the drawings, the same or similar components are denoted by the same or similar reference numerals.

In this specification, in order to indicate a positional relationship of components and the like, the upward direction of the drawing or the z direction described later is described as "upper", and the downward direction of the drawing or the direction opposite to the z direction is described as "lower". In this specification, the concepts of "upper" and "lower" do not necessarily represent the relationship with the direction of gravity.

First Embodiment

A semiconductor storage device according to an embodiment includes: a substrate having a substrate surface extending in a first direction and a second direction intersecting the first direction; a plurality of first region memory cells provided in a plurality of layers provided parallel to the substrate surface and in a third direction, the first region memory cells being provided above a rectangular shaped first region provided on the substrate surface, the first region having a first side parallel to the first direction and a second side parallel to the second direction when viewed from the third direction intersecting the first direction and the second direction; a plurality of first region wirings provided between the first region memory cells; a plurality of second region memory cells provided in the layers, the second region memory cells being provided above a rectangular shaped second region having a third side parallel to the first direction and a fourth side parallel to the second direction when viewed from the third direction; a plurality of second region wirings provided between the second region memory cells; and a control circuit capable of executing a reading operation, wherein, in the reading operation, the control circuit performs reading from one of the first region memory cells provided in one of the layers and another one of the second region memory cells provided in another one of the layers.

Then, the plurality of first region wirings include: a plurality of first wirings provided on the first region and provided along a longitudinal direction in the first direction; a plurality of second wirings provided on the plurality of first wirings and provided along a longitudinal direction in the second direction; and a plurality of third wirings provided on the plurality of second wirings, overlapping the plurality of first wirings, respectively, when viewed from the third direction, and provided along the longitudinal direction in the first direction, wherein the plurality of first region memory cells include: a plurality of first memory cells provided between the plurality of first wirings and the plurality of second wirings, respectively; and a plurality of second memory cells provided between the plurality of second wirings and the plurality of third wirings, respectively, and overlapping the plurality of first memory cells, respectively, when viewed from the third direction, wherein the plurality of second region wirings include: a plurality of fourth wirings provided on the second region and provided along the longitudinal direction in the first direction; a plurality of fifth wirings provided on the plurality of fourth wirings and provided along the longitudinal direction in the second direction; and a plurality of sixth wirings provided on the plurality of fifth wirings and overlapping the plurality of fourth wirings, respectively, when viewed from the third direction, along the longitudinal direction in the first direction, wherein the plurality of second region memory cells include: a plurality of third memory cells provided between the plurality of fourth wirings and the plurality of fifth wirings, respectively; and a plurality of fourth memory cells provided between the plurality of fifth wirings and the plurality of sixth wirings, respectively, and overlapping the plurality of third memory cells, respectively, when viewed from the third direction, and wherein the control circuit performs reading from the first memory cell and the fourth memory cell in the first reading operation and performs reading from the second memory cell and the third memory cell in the second reading operation.

FIG. 1 is a block diagram illustrating a configuration of a memory system 400 of the semiconductor storage device according to the embodiment.

The memory system 400 according to the embodiment is used by being connected to, for example, a host device 300. Herein, the host device 300 is, for example, a server, a personal computer, a mobile type information processing device, or the like.

The memory system 400 includes a plurality of semiconductor storage devices 3 and a memory controller 290. FIG. 1 illustrates a semiconductor storage device 3a, a semiconductor storage device 3b, a semiconductor storage device 3c, and a semiconductor storage device 3d as a plurality of the semiconductor storage devices 3.

The semiconductor storage device according to the embodiment is, for example, a volatile memory such as a phase-change memory (PCM) or a dynamic random access memory (DRAM) or a non-volatile memory such as a PCM, a NAND type electrically erasable and programmable read-only-memory (EEPROM), a resistive random access memory (ReRAM), or a magnetoresistive random access memory (MRAM).

The memory controller 290 includes a host I/F 210, a RAM 220, an error correction code (ECC) circuit 222, a logical/physical address mapping table storage memory 242, a buffer memory 240, and an I/F 250.

The memory controller 290 is, for example, a system-on-a-chip (SoC). The memory controller 290 may have, for example, a plurality of chips. The memory controller 290 may be provided with a field-programmable gate array (FPGA) or an application specific integrated circuit (ASIC) instead of a CPU 230. In other words, the memory controller 290 can be implemented by using software, hardware, or a combination thereof.

The host I/F 210 performs communication between the memory controller 290 and the host device 300. The host I/F 201 is connected to the host device 300 via a bus conforming to, for example, an advanced technology attachment (ATA) standard, a serial attached SCSI (SAS) standard, a peripheral components interconnected (PCI) Express™ standard, or the like.

The I/F 250 performs communication between the memory controller 290 and the semiconductor storage device 3. The I/F 250 is connected to the semiconductor storage device 3a, the semiconductor storage device 3b, the semiconductor storage device 3c, and the semiconductor storage device 3d via a bus CHa, a bus CHb, a bus CHc, and a bus CHd, respectively. The bus CHa, the bus CHb, the bus CHc, and the bus CHd correspond to different channels, respectively. That is, the memory controller 290 can perform communication with the semiconductor storage device 3a, the semiconductor storage device 3b, the semiconductor storage device 3c and the semiconductor storage device 3d via the bus CHa, the bus CHb, the bus CHc, and the bus CHd, respectively.

The CPU 230 controls operations of the memory controller 290.

The RAM 220 is used as a work area of the CPU 230. The buffer memory 240 temporarily stores the data transmitted to the semiconductor storage device 3 and the data transmitted from the semiconductor storage device 3. The RAM 220 and the buffer memory 240 include, for example, a dynamic random access memory (DRAM) or a static random access memory (SRAM).

The ECC circuit 222 detects and corrects errors of data by using an error correction code.

A logical/physical address mapping table storage memory 242 is a memory that stores a logical/physical address mapping table. The logical/physical address mapping table is information indicating the correspondence between a logical address and a physical address. The physical address is position information indicating a physical position in the semiconductor storage device 3. The logical address is position information indicating a position in a logical address space which the memory system 400 provides to the host device 300.

Figure 2:
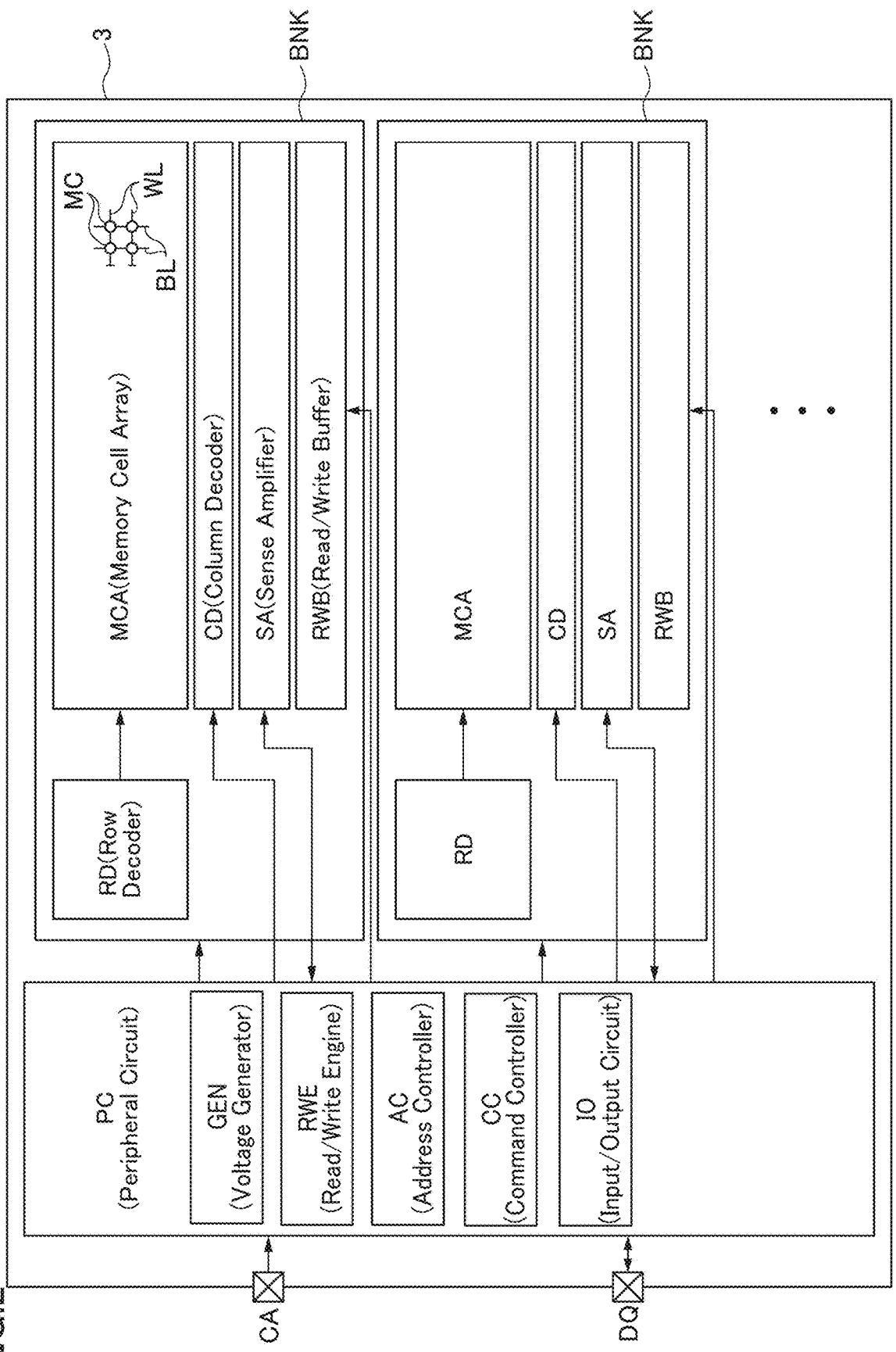
FIG. 2 is a block diagram illustrating a configuration of the semiconductor storage device according to the first embodiment.

FIG. 2 is a block diagram illustrating the configuration of the semiconductor storage device 3 according to the embodiment.

The semiconductor storage device 3 illustrated in FIG. 2 includes a memory cell array MCA, a column decoder CD, a row decoder RD, a sense amplifier SA, a read/write buffer RWB, and a peripheral circuit PC.

The memory cell array MCA includes, for example, a plurality of memory cells MC provided two-dimensionally in a matrix shape. The memory cell MC is, for example, a resistance change type memory such as PCM. The memory cell MC is provided, for example, at the intersection of the bit line BL and the word line WL. That is, the memory cell array MCA is a so-called cross-point type memory cell array. When viewed from the above of the semiconductor substrate, the bit line BL is substantially perpendicular with (intersects) the word line WL. Each of the plurality of bit lines BL is connected to one end of the corresponding memory cell MC in the memory cell array MCA. Each of the plurality of word lines WL is connected to the other end of the corresponding memory cell MC in the memory cell array MCA. The memory cell array MCA is divided into a plurality of banks BNK in one chip, and the sense amplifier SA, the read/write buffer RWB, the row decoder RD, and the column decoder CD are provided for each of the banks BNK.

The sense amplifier SA is connected to the memory cell MC, for example, via the bit line BL and applies a write voltage or a read voltage to the memory cell MC via the bit line BL. The sense amplifier SA writes data to the memory cell MC by applying the write voltage to the memory cell MC or reads data from the memory cell MC by applying the read voltage to the memory cell MC.

The read/write buffer RWB temporarily stores the data or address detected by the sense amplifier SA for each page or temporarily stores the data or address to be written to the memory cell array MCA for each page.

The row decoder RD and the column decoder CD access the memory cell array MCA based on a bank address and a page address and apply the write voltage and the read voltage to the word line WL and the bit line BL. The row decoder RD applies the write voltage or the read voltage to a selected word line selected from among the plurality of word lines WL. The column decoder CD connects a selected bit line selected from among the plurality of bit lines BL to the sense amplifier SA. The sense amplifier SA applies the write voltage or the read voltage to the selected bit line. Accordingly, the semiconductor storage device 3 can write data to the desired memory cell MC in the memory cell MC or read data from the desired memory cell MC.

Figure 3:
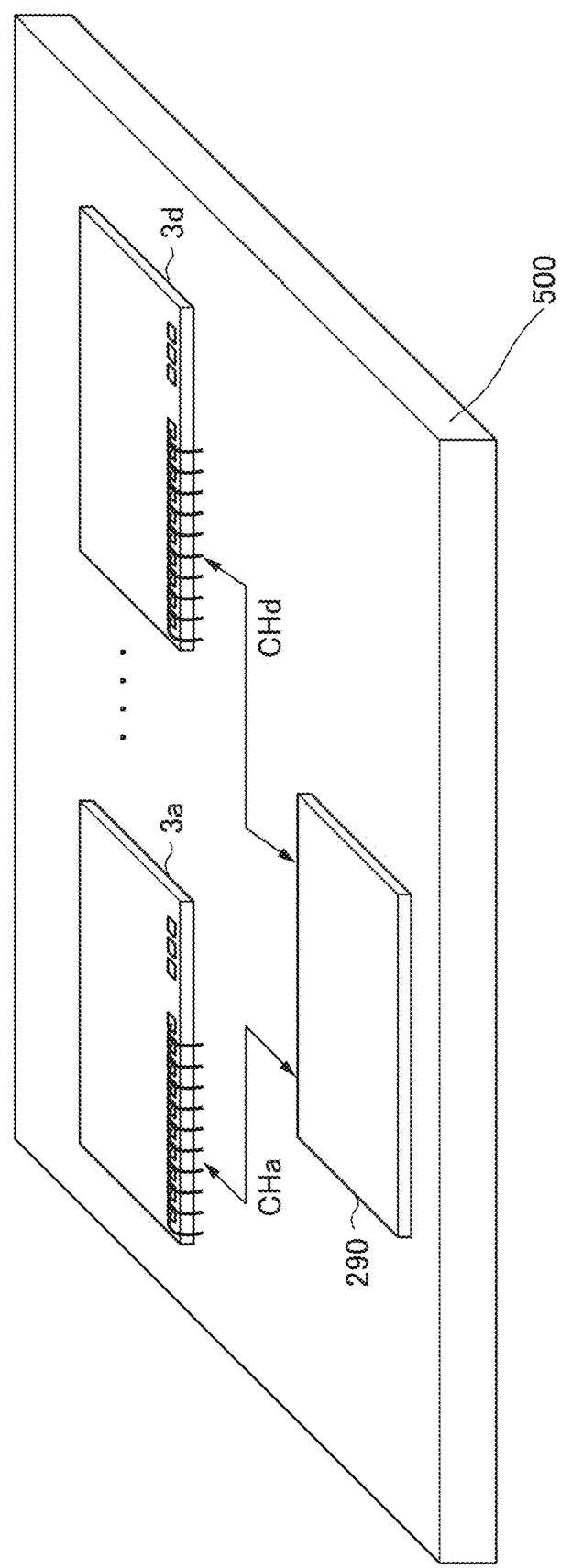
FIG. 3 is a block diagram illustrating the configuration of the semiconductor storage device according to the first embodiment.

FIG. 3 is a diagram schematically illustrating an implementation example of the semiconductor storage device 3 according to the embodiment. For example, the memory controller 290 and each semiconductor storage device 3 are provided on the same substrate 500. The memory controller 290 and each semiconductor storage device 3 are connected by a bus CH.

Figure 4:
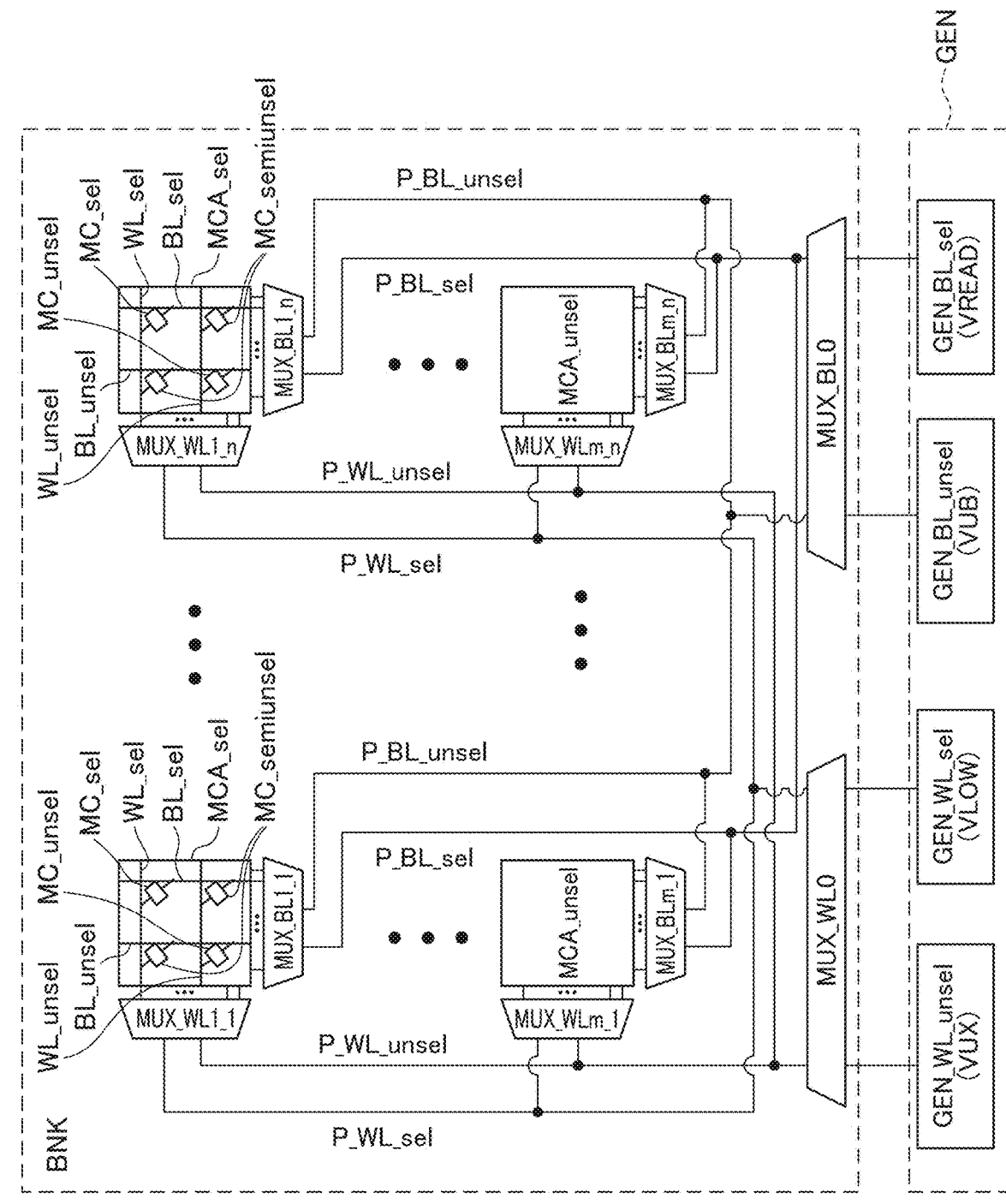
FIG. 4 is a block diagram illustrating the configuration of the semiconductor storage device according to the first embodiment.

The peripheral circuit PC includes, for example, a voltage generation circuit GEN, a read/write engine RWE, an address controller AC, a command controller CC, an input/output circuit IC, and the like. The voltage generation circuit GEN generates a voltage of the word line WL and a voltage of the bit line BL required for a data reading operation and a data writing operation. A more detailed configuration of the voltage generation circuit GEN is illustrated in FIG. 4. The read/write engine RWE controls the column decoder CD and row decoder RD so as to write data to the desired memory cell MC in the bank BNK according to commands and addresses or reads data from the desired memory cell MC in the bank BNK. The read/write engine RWE transmits a read data to a data input/output terminal DQ of the input/output circuit. The address controller AC receives the row address, the column address, and the like and decodes these addresses. The command controller CC receives commands indicating various operations such as the data reading operation and the data writing operation and transmits these commands to the read/write engine RWE. The input/output circuit TO takes in the command and the address from the command/address input terminal CA, transmits the command to the command controller CC, and transmits the address to the address controller AC. The command includes a write command instructing a writing operation and a read command instructing a reading operation. The address includes the bank address indicating any one of the banks BNK of the memory cell array MCA and an address indicating a page or memory cell MC that is a read or write target in the bank BNK. In addition, the input/output circuit IC takes in a write data from the data input/output terminal DQ and transmits the write data to the read/write buffer RWB. Alternatively, the input/output circuit receives the read data stored in a data latch DL and outputs the read data from the data input/output terminal DQ.

A memory controller (not illustrated) may be provided outside the semiconductor storage device 3. In addition, the memory system may be configured with a plurality of semiconductor storage devices 3 and a memory controller (not illustrated) that controls the whole.

FIG. 4 is a block diagram illustrating a more detailed configuration example of the bank BNK, the column decoder CD, and the row decoder RD in the semiconductor storage device 3. The column decoder CD includes multiplexers MUX_BL1_1 to MUX_BLm_n and MUX_BL0. The row decoder RD includes multiplexers MUX_WL1_1 to MUX_WLm_n and MUX_WL0. The bank BNK may include a plurality of memory cell arrays MCA subdivided corresponding to the multiplexers MUX_BL1_1 to MUX_BLm_n and MUX_WL1_1 to MUX_WLm_n.

In addition, as illustrated in FIG. 4, the voltage generation circuit GEN includes a selected BL voltage generation circuit GEN_BL_sel, an unselected BL voltage generation circuit GEN_BL_unsel, a selected WL voltage generation circuit GEN_WL_sel, and an unselected WL voltage generation circuit GEN_WL_unsel.

The multiplexer is configured by using a switching element such as a metal oxide semiconductor field effect transistor (MOSFET).

The column decoder CD includes the multiplexers MUX_BL1_1 to MUX_BLm_n and MUX_BL0. Each of the multiplexers MUX_BL1_1 to MUX_BLm_n is provided corresponding to the memory cell array MCA and is connected to a plurality of the bit lines BL of each memory cell array MCA. It is noted that m and n are integers of 1 or more, respectively.

The selected BL voltage generation circuit GEN_BL_sel and the unselected BL voltage generation circuit GEN_BL_unsel are connected to the multiplexer MUX_BL0 of the column decoder CD. The multiplexer MUX_BL0 is connected to the multiplexers MUX_BL1_1 to MUX_BLm_n corresponding to the respective memory cell arrays MCA via bit line paths P_BL_sel and P_BL_unsel.

The multiplexers MUX_BL1_1 to MUX_BLm_n connect one selected bit line BL_sel selected from among the bit lines BL of the corresponding memory cell array MCA to the selected bit line path P_BL_sel and apply a selected bit line voltage V_bl_sel. The multiplexers MUX_BL1_1 to MUX_BLm_n connect an unselected bit line BL_unsel other than the selected bit line BL_sel to the unselected bit line path P_BL_unsel and apply an unselected bit line voltage V_bl_unsel.

The multiplexer MUX_BL0 is connected between the selected BL voltage generation circuit GEN_BL_sel and the plurality of bit line paths and between the unselected BL voltage generation circuit GEN_BL_unsel and the plurality of bit line paths. The multiplexer MUX_BL0 connects one bit line path selected from among the plurality of bit line paths to the selected BL voltage generation circuit GEN_BL_sel as the selected bit line path P_BL_sel. On the other hand, the multiplexer MUX_BL0 connects the unselected bit line path among the plurality of bit line paths to the unselected BL voltage generation circuit GEN_BL_unsel as P_BL_unsel.

The bit line paths P_BL_sel and P_BL_unsel are wiring paths connected between the multiplexers MUX_BL1_1 to MUX_BLm_n and the multiplexer MUX_BL0. For example, 16, 32, 64, or 1024 bit line paths are provided. As described above, the multiplexer MUX_BL0 selects one of the plurality of bit line paths and connects the selected bit line path P_BL_sel to the selected BL voltage generation circuit GEN_BL_sel. The selected bit line path P_BL_sel transmits the selected bit line voltage V_bl_sel. On the other hand, the multiplexer MUX_BL0 connects the unselected bit line path P_BL_unsel among the plurality of bit line paths to the unselected BL voltage generation circuit GEN_BL_unsel. The bit line path P_BL_unsel transmits the unselected bit line voltage V_bl_unsel.

The selected BL voltage generation circuit GEN_BL_sel generates the selected bit line voltage V_bl_sel to be applied to the selected bit line BL_sel from an external power supply. The selected bit line voltage V_bl_sel is a high level voltage, for example, a few volts. The selected bit line path P_BL_sel transmits the selected bit line voltage V_bl_sel from the multiplexer MUX_BL0 to the multiplexers MUX_BL1_1 to MUX_BLm_n. The multiplexers MUX_BL1_1 to MUX_BLm_n and MUX_BL0 electrically connect the selected bit line BL_sel among the plurality of bit lines BL to the selected BL voltage generation circuit GEN_BL_sel via the selected bit line path P_BL_sel and selectively apply the selected bit line voltage V_bl_sel to the selected bit line BL_sel.

The unselected BL voltage generation circuit GEN_BL_unsel generates the unselected bit line voltage V_bl_unsel to be applied to the unselected bit line BL_unsel from the external power supply. The unselected bit line voltage V_bl_unsel is a voltage between the selected bit line voltage V_bl_sel and a selected word line voltage V_wl_sel and is, for example V_bl_sel/2. The unselected bit line path P_BL_unsel transmits the unselected bit line voltage V_bl_unsel from the multiplexer MUX_BL0 to the multiplexers MUX_BL1_1 to MUX_BLm_n. The multiplexers MUX_BL0 and MUX_BL1_1 to MUX_BLm_n electrically connect the unselected bit line BL_unsel to the unselected BL voltage generation circuit GEN_BL_unsel via the unselected bit line path P_BL_unsel and selectively apply the unselected bit line voltage V_bl_unsel to the unselected bit line BL_unsel.

The row decoder RD includes the multiplexers MUX_WL1_1 to MUX_WLm_n and MUX_WL0. Each of the multiplexers MUX_WL1_1 to MUX_WLm_n is provided corresponding to the memory cell array MCA and is connected to a plurality of the word lines WL of each memory cell array MCA.

The selected WL voltage generation circuit GEN_WL_sel and the unselected WL voltage generation circuit GEN_WL_unsel are connected to the multiplexer MUX_WL0 of the row decoder RD. The multiplexer MUX_WL0 is connected to the multiplexers MUX_WL1_1 to MUX_WLm_n corresponding to the respective memory cell arrays MCA via word line paths P_WL_sel and P_WL_unsel.

The multiplexers MUX_WL1_1 to MUX_WLm_n connect one selected word line WL_sel selected from among the word lines WL of the corresponding memory cell array MCA to the word line path P_WL_sel and apply the selected word line voltage V_wl_sel. The multiplexers MUX_WL1_1 to MUX_WLm_n connect other unselected word line WL_unsel other than the selected word line WL_sel to the word line path P_WL_unsel and apply an unselected word line voltage V_wl_unsel. The multiplexer MUX_WL0 is connected between the selected WL voltage generation circuit GEN_WL_sel and the plurality of word line paths and between the unselected WL voltage generation circuit GEN_WL_unsel and the plurality of word line paths. The multiplexer MUX_WL0 connects one word line path selected from among the plurality of word line paths to the selected WL voltage generation circuit GEN_WL_sel as the word line path P_WL_sel. On the other hand, the multiplexer MUX_WL0 connects the unselected word line path among the plurality of word line paths to the unselected WL voltage generation circuit GEN_WL_unsel as the word line path P_WL_unsel.

The word line paths P_WL_sel and P_WL_unsel are wiring paths connected between the multiplexers MUX_WL1_1 to MUX_WLm_n and the multiplexer MUX_WL0. For example, 16, 32, 64, or 1024 word line paths are provided. As described above, the multiplexer MUX_WL0 selects one of the plurality of word line paths and connects the selected word line path P_WL_sel to the selected WL voltage generation circuit GEN_WL_sel. The word line path P_WL_sel transmits the selected word line voltage V_wl_sel. On the other hand, the multiplexer MUX_WL0 connects the unselected word line path P_WL_unsel among the plurality of word line paths to the unselected WL voltage generation circuit GEN_WL_unsel. The word line path P_WL_unsel transmits the unselected word line voltage V_wl_unsel. The selected WL voltage generation circuit GEN_WL_sel generates the selected word line voltage V_wl_sel to be applied to the selected word line WL_sel from the external power supply. The selected word line voltage V_wl_sel is a low level voltage, for example, ground voltage (0 V). The word line path P_WL_sel transmits the selected word line voltage V_wl_sel from the multiplexer MUX_WL0 to the multiplexers MUX_WL1_1 to MUX_WLm_n. The multiplexers MUX_WL1_1 to MUX_WLm_n and MUX_WL0 electrically connect the selected word line WL_sel among the plurality of word lines WL to the selected WL voltage generation circuit GEN_WL_sel via the selected word line path P_WL_sel and selectively apply the selected word line voltage V_wl_sel to the selected word line WL_sel.

The unselected WL voltage generation circuit GEN_WL_unsel generates the unselected word line voltage wl_unsel to be applied to the unselected word line WL_unsel from the external power supply. The unselected word line voltage V_wl_unsel is a voltage between the selected bit line voltage V_bl_sel and the selected word line voltage V_wl_sel and is, for example, V_bl_sel/2. The unselected word line voltage V_wl_unsel is preferably substantially equal to the unselected bit line voltage V_bl_unsel. However, the unselected word line voltage V_wl_unsel may be different from the unselected bit line voltage V_bl_unsel. The unselected word line path P_WL_unsel transmits the unselected word line voltage V_wl_unsel from the multiplexer MUX_WL0 to the multiplexers MUX_WL1_1 to MUX_WLm_n. The multiplexers MUX_WL1_1 to MUX_WLm_n electrically connect the unselected word line WL_unsel to the unselected WL voltage generation circuit GEN_WL_unsel via the unselected word line path P_WL_unsel and selectively apply the unselected word line voltage V_wl_unsel to the unselected word line WL_unsel.

In this manner, a voltage difference between the selected bit line voltage V_bl_sel and the selected word line voltage V_wl_sel is applied to a selected memory cell MC_sel connected to the selected bit line BL_sel and the selected word line WL_sel. Accordingly, data is read from the selected memory cell MC_sel, or data is written to the selected memory cell MC_sel.

It is noted that the configurations of the bank BNK, the column decoder CD, and the row decoder RD are not limited thereto. For example, the mode of connection between each multiplexer and each memory cell array MCA is not limited thereto. For example, herein, an example is illustrated in which the bit line BL is one layer (BL0), the word line WL is one layer (WL0), and the memory cell is one layer. However, the number of layers of the bit line BL, the number of layers of the word line WL, and the number of layers of the memory cell are not limited thereto. For example, another layer of the bit line BL may be provided so that the total number of wiring lines is three layers (for example, BL0, WL0, and BL1), and thus, the memory cell may have a two-layer structure. In this case, the column decoder CD and the row decoder RD are configured so as to be able to drive a plurality of the bit lines BL and a plurality of the word lines WL, respectively. In addition, the total number of layers of the bit line BL and the word line WL may be five layers (for example, BL0, WL0, BL1, WL1, and BL2), and thus, the memory cell may have a four-layer structure. Also in this case, the column decoder CD and the row decoder RD are configured so as to be able to drive a plurality of the bit lines BL and a plurality of the word lines WL, respectively, but any one (for example, the bit lines BL) of the bit lines BL and the word lines WL may be configured to be able to be independently driven in units of even-numbered layers (for example, the bit lines BL0 and BL2) and odd-numbered layers (for example, the bit line BL1).

Figure 5A:
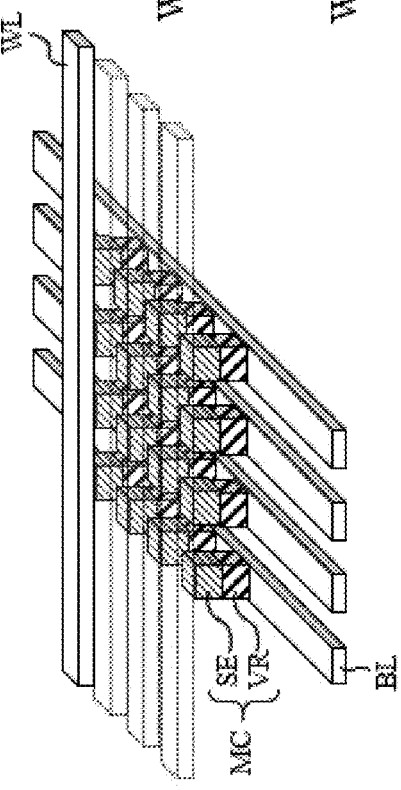
FIGS. 5A and 5B are schematic views of a memory cell array MCA of the first embodiment.
Figure 5B:
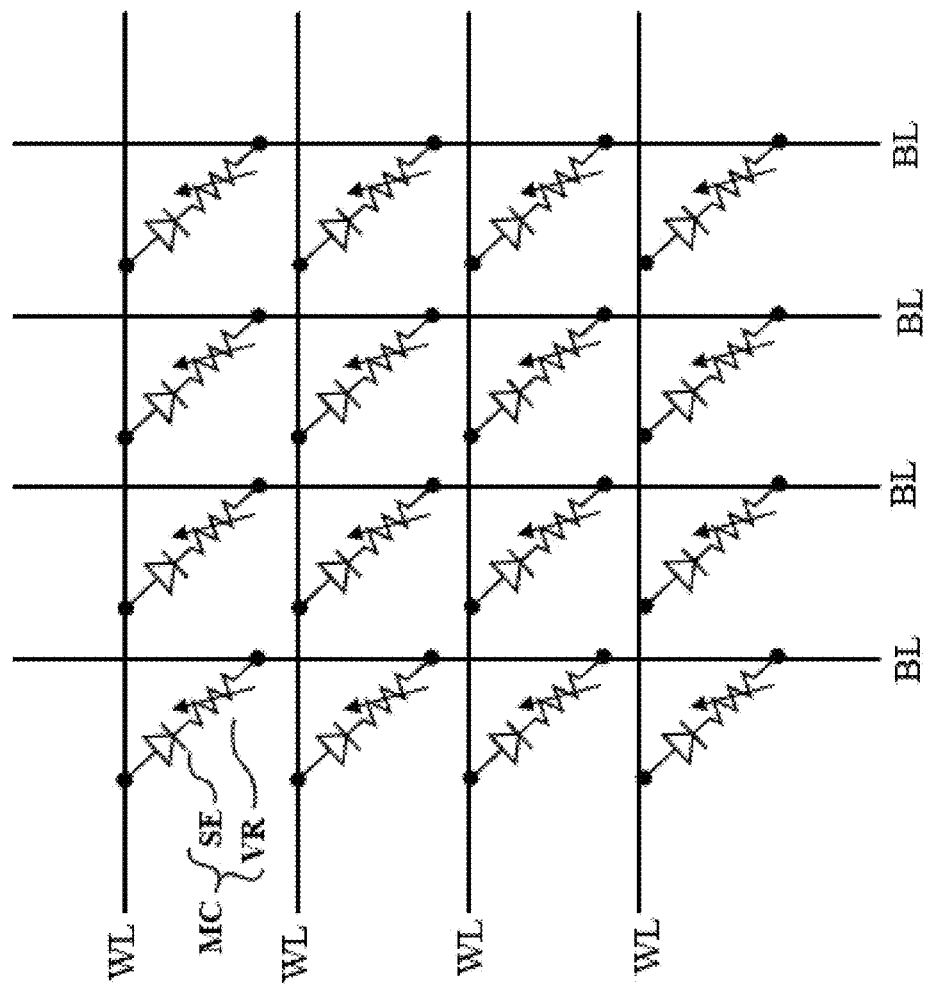

FIGS. 5A and 5B are schematic views of the memory cell array MCA of the embodiment.

FIG. 5A is a perspective view schematically illustrating the memory cell MC, the bit lines BL, and the word lines WL included in the memory cell array MCA.

As illustrated in FIG. 5A, for example, a plurality of the bit lines BL are extended in the same direction at intervals, and above that, a plurality of the word lines WL are extended at intervals, for example, in a direction perpendicular to the direction in which the bit lines BL are extended. Then, the plurality of memory cells MC are provided at the intersections of the plurality of bit lines BL and the plurality of word lines WL, respectively. Accordingly, the cross-point type memory cell array MCA is configured in which the plurality of memory cells MC are provided in a matrix shape when viewed in a plan.

It is noted that FIG. 5A illustrates an example in which each of the bit line BL and the word line WL is one layer and the memory cell MC of one layer is provided between the bit line BL and the word line WL, but the embodiment is not limited thereto. The layer in which the memory cell MC is provided may be further increased, and correspondingly, the layer of the bit line BL and/or the word line WL may be further increased. For example, the plurality of bit lines BL extending in a direction perpendicular to the direction in which the word line WL extends may be further provided at intervals on the plurality of word lines WL in FIG. 5B, and the plurality of memory cells MC may be further provided at the intersections of the plurality of word lines WL and the plurality of bit lines BL in the upward direction. In this case, the memory cell MC has two layers, and a wiring layer (the layer of the bit line BL and the layer of the word line WL) has three layers.

FIG. 5B is a diagram schematically illustrating a circuit configuration of the memory cell array MCA included in the semiconductor storage device 3. Each memory cell MC is connected between the corresponding one word line WL and the corresponding one bit line BL. The memory cell MC includes, for example, a variable resistance element VR and a switch element SE.

The variable resistance element VR can be in a low resistance state and a high resistance state. The variable resistance element VR stores a one-bit data, that is, a first value and a second value by utilizing a difference of the resistance states between the low resistance state and the high resistance state. It is noted that the low resistance state may be the first value and the high resistance state may be the second value, or the low resistance state may be the second value and the high resistance state may be the first value.

The switch element SE is, for example, in a high resistance state (non-conducting state, off state) when the applied voltage is less than a threshold value and in a low resistance state (conducting state, on state) when the applied voltage is equal to or more than the threshold value. Accordingly, the switch element SE functions as a rectifying element having a rectifying function. The switch element SE may be a bidirectional rectifying element. It is noted that the configuration of the memory cell array MCA is not limited thereto.

Figure 6:
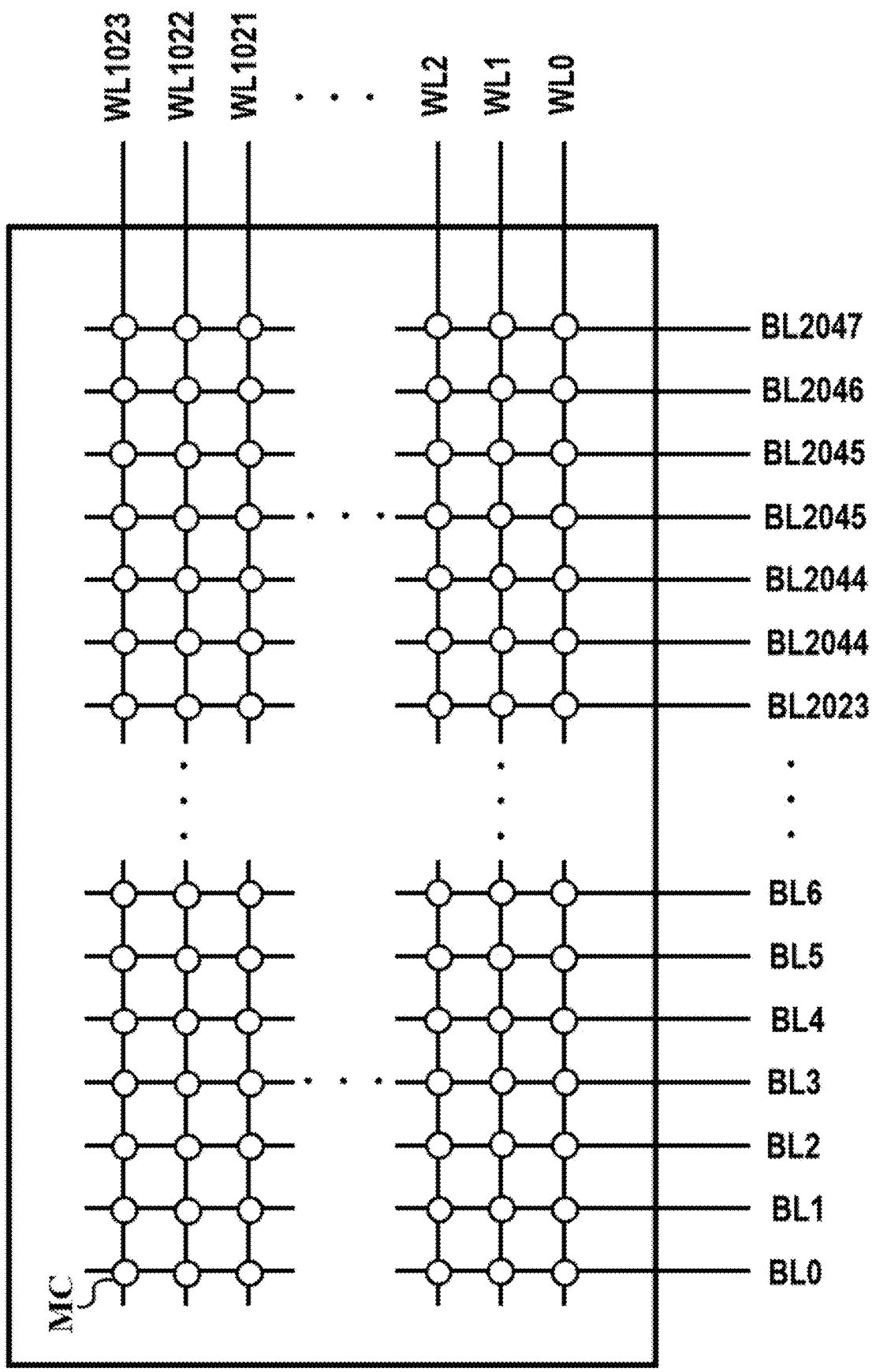
FIG. 6 is a schematic diagram illustrating a connection relationship between the memory cell array MCA, bit lines BL, and word lines WL of the first embodiment.

FIG. 6 is a schematic diagram illustrating a connection relationship between the bit lines BL and the word lines WL with respect to the memory cell array MCA included in the semiconductor storage device 3 according to the embodiment. For example, 2048 bit lines BL and 1024 word lines are connected to the memory cell array MCA. It is noted that the total number of bit lines BL and word lines WL is not limited thereto. For example, the total number of bit lines BL and word lines WL may be, for example, 32, 64, and 1024, respectively. Furthermore, one semiconductor storage device 3 may be provided with the plurality of memory cell arrays MCA. The bit line BL and the word line WL may be connected to, for example, a first sense amplifier 13, a second sense amplifier 14, or a peripheral circuit unit 1b (FIGS. 2 and 4).

Figure 7:
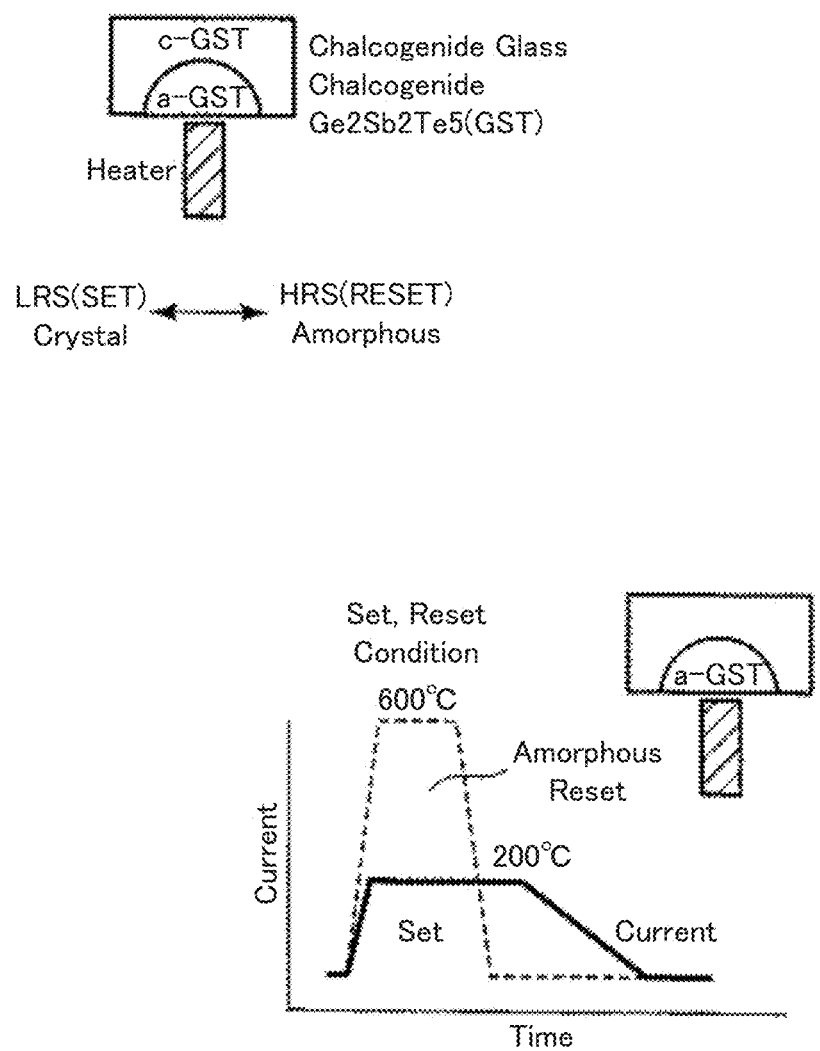
FIG. 7 is a schematic diagram schematically illustrating a function of a variable resistance element of the first embodiment.

FIG. 7 schematically illustrates a function of the variable resistance element VR in the embodiment. In the embodiment, the variable resistance element VR includes, for example, a chalcogenide glass (GST: $Ge_2Sb_2Te_5$). When a current is allowed to flow between the bit line BL and the word line WL, an electrode provided adjacent to the variable resistance element VR functions as a heater to generate heat. Due to the heat, the chalcogenide glass is melted, and thus, the state can be transitioned. For example, when the chalcogenide glass is melted at a high temperature (high current) and is cooled at high speed (the current is stopped), the chalcogenide glass becomes an amorphous state (reset operation), and when the chalcogenide glass is melted at a relatively low high temperature (low current) and is cooled slowly (the current is gradually reduced), the chalcogenide glass is crystallized (set operation). Accordingly, during the reading, determination of 1-bit information is performed depending on whether the current flowing between the bit line BL and the word line WL is large (low resistance state=crystalized state) and low (high resistance state=amorphous state). It is noted that, although a cell configuration using the chalcogenide glass is illustrated herein, the material used in the embodiment is not limited to the chalcogenide glass.

Figure 8:
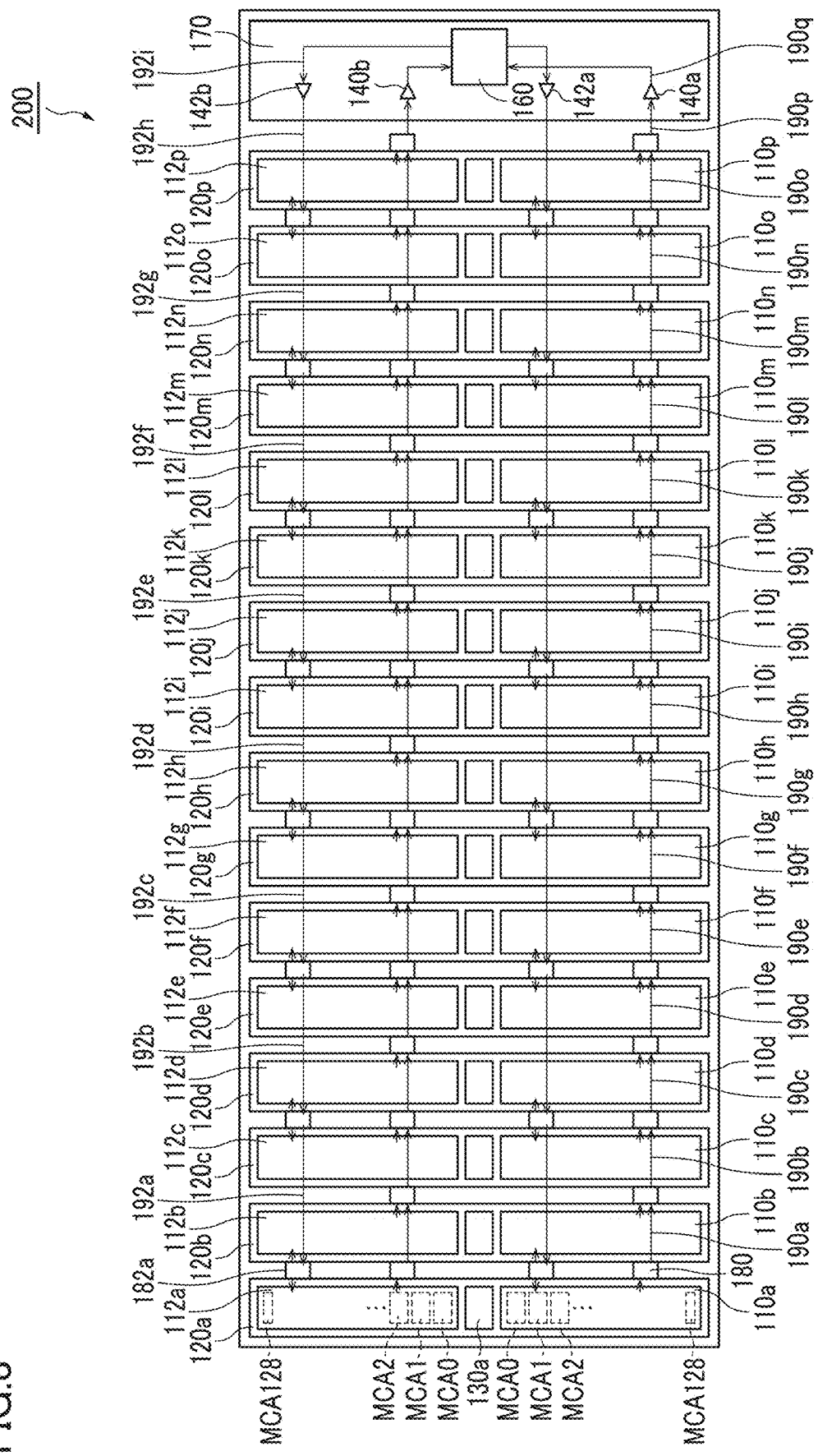
FIG. 8 is a schematic view illustrating other main components of the semiconductor storage device according to the first embodiment.

FIG. 8 is a schematic view illustrating main components of the semiconductor storage device 200 according to the embodiment. The semiconductor storage device 200 includes banks 120. In FIG. 8, banks 120a, 120b, 120c, 120d, 120e, 120f, 120g, 120h, 120i, 120j, 120k, 120l, 120m, 120n, 120o, and 120p as the banks 120 are provided from the left to the right on the paper.

Each of the banks 120 has a half bank 110 and a half bank 112. In FIG. 8, half banks 110a, 110b, 110c, 110d, 110e, 110f, 110g, 110h, 110i, 110j, 110k, 110l, 110m, 110n, 110o and 110p are illustrated as the half banks 110. In addition, in FIG. 8, half banks 112a, 112b, 112c, 112d, 112e, 112f, 112g, 112*h*, 112*i*, 112*j*, 112*k*, 112*l*, 112*m*, 112*n*, 112*o* and 112*p* are illustrated as the half banks 112. In the half bank 110, memory cell arrays MCA0, MCA1, MCA2, . . . , and MCA127 are provided from the top to the bottom on the paper. In the half bank 112, memory cell arrays MCA0, MCA1, MCA2, . . . , and MCA127 are provided from the bottom to the top on the paper.

In addition, the semiconductor storage device 200 includes a peripheral circuit 170, a read data bus 190, and a write data bus 192. The peripheral circuit 170 includes a first control circuit 160, a buffer 140, and a buffer 142.

The read data bus 190 connects each half bank 110 and each half bank 112 via a logic circuit 180 provided between each half bank 110 and each half bank 112. FIG. 8 illustrates read data buses 190*a*, 190*b*, 190*c*, 190*d*, 190*e*, 190*f*, 190*g*, 190*h*, 190*i*, 190*j*, 190*k*, 190*l*, 190*m*, 190*n*, and 190*o* as the read data buses 190 connecting the respective half banks 110. It is noted that the logic circuit 180 may further be embedded with a buffer. In addition, the read data bus 190 is connected to the first control circuit 160 via a buffer 140*a* or a buffer 140*b* as the buffer 140. FIG. 8 illustrates read data buses 190*p* and 190*q* as the read data buses 190 that connect the buffer 140*a* and the first control circuit 160 to another read data bus 190.

Figure 9:
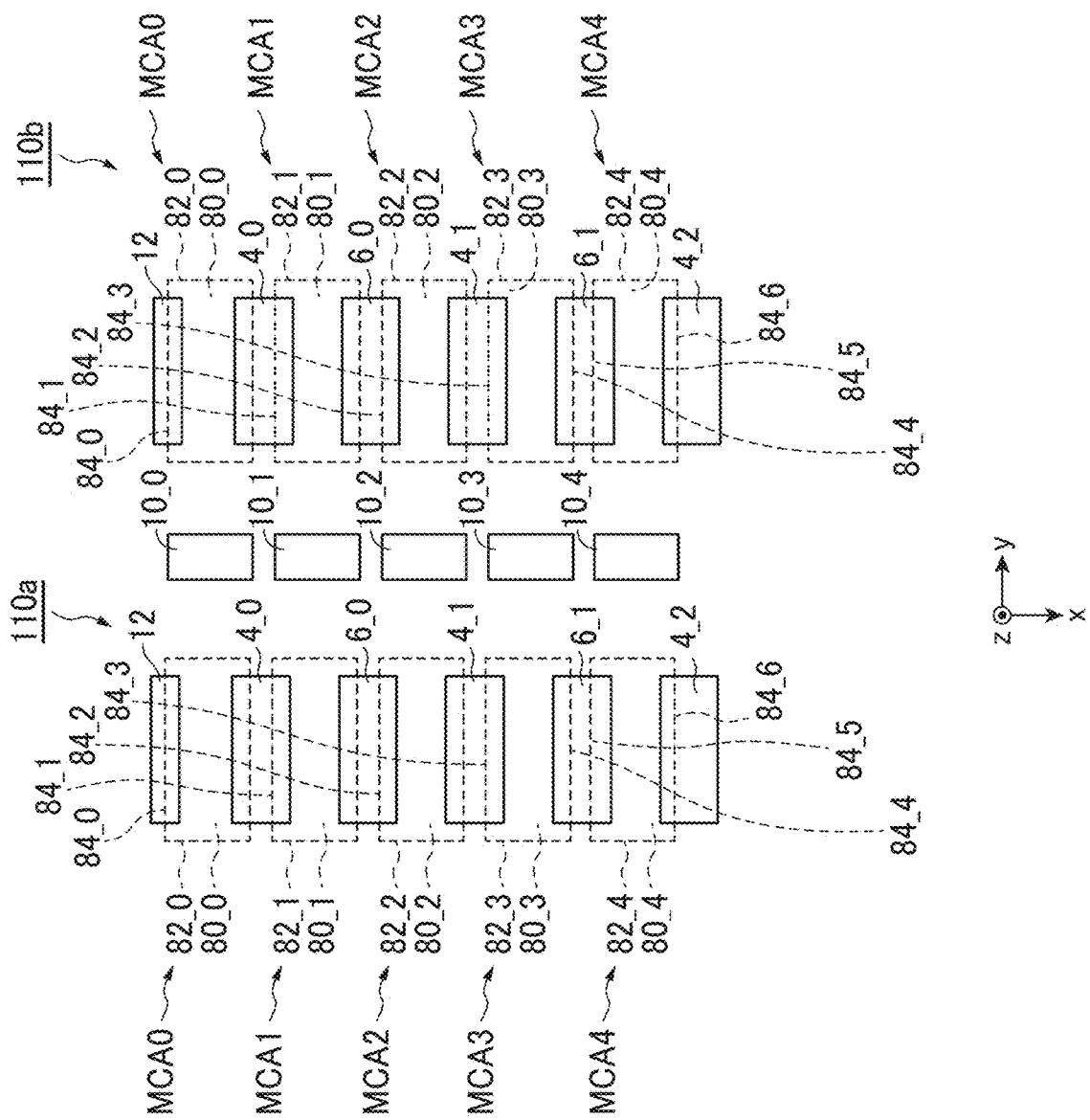
FIG. 9 is a schematic view illustrating main components of the semiconductor storage device according to the first embodiment.
Figure 10:
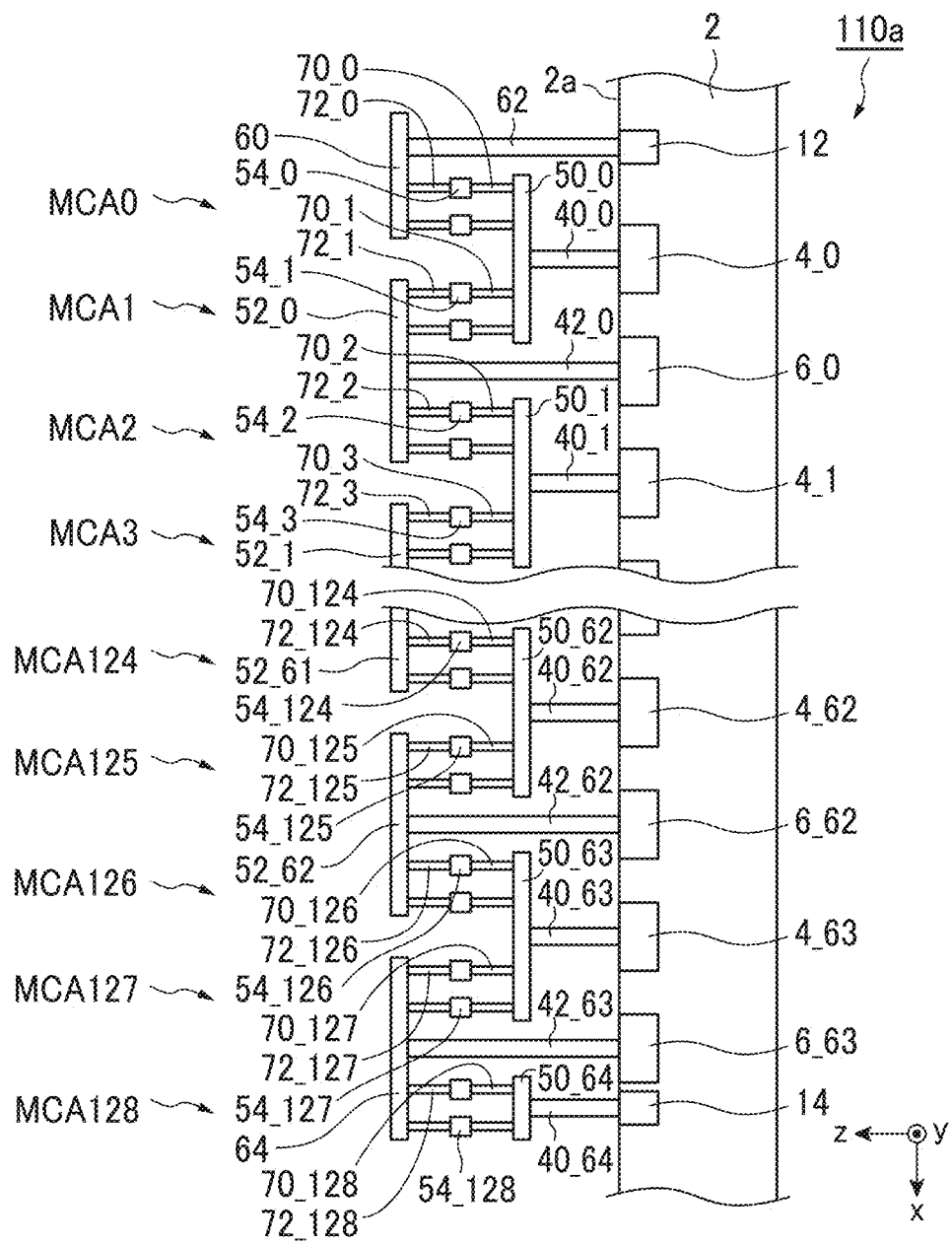
FIG. 10 is a schematic view illustrating main components of the semiconductor storage device according to the first embodiment.

More specifically, although not illustrated in FIG. 8, the read data bus 190 connects a read register 24 (for example, illustrated in FIG. 11) provided in each half bank 110 and each half bank 112 to the first control circuit 160 via the logic circuit 180. For example, when a semiconductor storage device 100 using FIGS. 9 and 10 is used as the half bank 110 or the half bank 112, since the number of read registers is 64, a total of 64 read data buses 190 are provided for connection of the half bank 110 or the half bank 112 and the first control circuit 160.

The write data bus 192 connects each half bank 110 and each half bank 112 via a logic circuit 182 provided between each half bank 110 and each half bank 112. FIG. 8 illustrates write data buses 192*a*, 192*b*, 192*c*, 192*d*, 192*e*, and 192*f* as the write data buses 192 that connect the respective half banks 112. It is noted that logic circuit 182 may further be embedded with buffers. In addition, the write data bus 192 is connected to the first control circuit 160 via a buffer 142*a* or a buffer 142*b* as the buffer 142. FIG. 8 illustrates write data buses 192*h* and 192*i* as the write data buses 192 that connect the buffer 142*b* and the first control circuit 160 to another write data bus 192.

More specifically, although not illustrated in FIG. 8, the write data bus 192 connects a write register 26 (for example, illustrated in FIG. 11) provided in each half bank 110 and each half bank 112 to the first control circuit 160 via the logic circuit 182. For example, when the semiconductor storage device 100 using FIGS. 9 and 10 is used as the half bank 110 or the half bank 112, since the number of registers is 64, a total of 64 write data buses 192 are provided for connection of the half bank 110 or the half bank 112 and the first control circuit 160.

The banks 120 have respective second control circuits 130 between the respective half banks 110 and the respective half banks 112. In FIG. 8, a second control circuit 130*a* as the second control circuit 130 is illustrated in the bank 120*a*. It is noted that, although not illustrated in FIG. 8, the banks 120*b*, 120*c*, 120*d*, 120*e*, 120*f*, 120*g*, 120*h*, 120*i*, 120*j*, 120*k*, 120*l*, 120*m*, 120*n*, 120*o*, and 120*p* are also provided with the respective second control circuit 130. The second control circuit 130 is used to control both the half bank 110 and the half bank 112 in each of the banks 120.

FIGS. 9 and 10 are schematic views illustrating main components of the semiconductor storage device according to the embodiment. FIG. 10 is an example of a schematic cross-sectional view of the semiconductor storage device according to the embodiment in a plane perpendicular to the substrate 2.

In FIG. 9, the memory cell arrays MCA0, MCA1, MCA2, MCA3, and MCA4 of the half bank 110*a*, the memory cell arrays MCA0, MCA1, MCA2, MCA3, and MCA4 of the half bank 110*b* and peripheral elements thereof are illustrated. The memory cell arrays MCA5, MCA6, MCA127, and MCA128 of the half bank 110*a*, memory cell arrays MCA5, MCA6, MCA127, and MCA128 of the half bank 110*b*, and peripheral elements thereof are omitted in illustration.

Herein, the x direction, the y direction that intersects perpendicularly to the x direction, and the z direction that intersects perpendicularly to the x direction and the y direction are defined. FIG. 10 is an example of a schematic cross-sectional view of the semiconductor storage device according to the embodiment in the xz plane. It is noted that, although FIG. 10 illustrates a schematic cross-sectional view of the half bank 110*a*, the same applies to the schematic cross-sectional view of the half bank 110*b* in the embodiment.

The half bank 110 has the substrate 2. The substrate 2 is, for example, a semiconductor substrate such as a Si substrate, but the substrate 2 is not limited thereto. The substrate 2 is assumed to be provided parallel to the xy plane. The substrate 2 has a substrate surface 2*a* extending in the x direction and the y direction. For example, both the half bank 110*a* and the half bank 110*b* are assumed to have the same substrate 2.

On the substrate surface 2*a*, for each of the half bank 110*a* and the half bank 110*b*, as the regions 80, a region 80_0, a region 80_1, a region 80_2, a region 80_3, a region 80_4, a region 80_5, . . . , a region 80_124, a region 80_125, a region 80_126, a region 80_127, and a region 80_128 are provided in order along the x direction. Each of the regions 80 has a rectangular shape and has a side 82 parallel to the x direction and a side 84 intersecting the side 82 and parallel to the y direction. It is noted that, in FIG. 9, the illustration of the region 80_5, . . . , the region 80_124, the region 80_125, the region 80_126, the region 80_127, and the region 80_128 is omitted.

In addition, each of the memory cell arrays MCA is provided above each of the regions 80. For example, the memory cell array MCA0 is provided above the region 80_0. Similarly, the memory cell array MCAT is provided above the region 80_1. The memory cell array MCA2 is provided above the region 80_2. The memory cell array MCA3 is provided above the region 80_3. The memory cell array MCA124 is provided above the region 80_124. The memory cell array MCA125 is provided above the region 80_125. The memory cell array MCA126 is provided above the region 80_126. The memory cell array MCA127 is provided above the region 80_127. The memory cell array MCA128 is provided above the region 80_128.

Next, a specific configuration of the memory cell arrays MCA in the semiconductor storage device according to the embodiment will be described below.

The half bank 110 includes bit lines BL0 50 as the bit lines BL0. More specifically, the half bank 110 includes bit lines BL0 50_0, BL0 50_1, BL0 50_62, BL0 50_63, and BL0 50_64. Each of the bit lines BL0 50 is provided across the two regions 80, in other words, each of the bit lines BL0 50 is provided so as to be parallel to the substrate surface 2*a* along the longitudinal direction in the x direction so as to straddle the two regions. The bit line BL0 50_0 is provided across the region 80_0 and the region 80_1. The bit line BL0 50_1 is provided across the region 80_2 and the region 80_3. The bit line BL0 50_62 is provided across the region 80_124 and the region 80_125. The bit line BL0 50_63 is provided across the region 80_126 and the region 80_127. Furthermore, the bit line BL0 50_64 is provided on one region 80_128. In addition, each of the bit lines BL0 50 is provided so as to be passed by a first virtual line parallel to the x direction. It is noted that, in FIG. 6A, for the convenience of illustration, for example, only one bit line BL0 50_0 is illustrated. However, actually, a plurality of the bit lines BL0 50_0 is provided side by side in the y direction. The same applies to other bit lines BL0.

In addition, the semiconductor storage device 100 includes word lines WL0 54 as the word lines WL0. More specifically, the semiconductor storage device 100 includes word lines WL0 54_0, WL0 54_1, WL0 54_2, WL0 54_3, ..., WL0 54_124, WL0 54_125, WL0 54_126, WL0 54_127, and WL0 54_128. Each of the word lines WL0 54 is provided above the bit line BL0 50 above each of the regions 80 so as to be parallel to the substrate surface 2a along the longitudinal direction in the y direction. The word line WL0 54_0 is provided above the bit line BL0 50_0 above the region 80_0 so as to be parallel to the substrate surface 2a along the longitudinal direction in the y direction. The word line WL0 54_1 is provided above the bit line BL0 50_0 above the region 80_1 so as to be parallel to the substrate surface 2a along the longitudinal direction in the y direction. The word line WL0 54_2 is provided above the bit line BL0 50_1 above the region 80_2 so as to be parallel to the substrate surface 2a along the longitudinal direction in the y direction. The word line WL0 54_3 is provided above the bit line BL0 50_1 above the region 80_3 so as to be parallel to the substrate surface 2a along the longitudinal direction in the y direction. The word line WL0 54_124 is provided above the bit line BL0 50_62 above the region 80_124 so as to be parallel to the substrate surface 2a along the longitudinal direction in the y direction. The word line WL0 54_125 is provided above the bit line BL0 50_62 above the region 80_125 so as to be parallel to the substrate surface 2a along the longitudinal direction in the y direction. The word line WL0 54_126 is provided above the bit line BL0 50_63 above the region 80_126 so as to be parallel to the substrate surface 2a along the longitudinal direction in the y direction. The word line WL0 54_127 is provided above the bit line BL0 50_63 above the region 80_127 so as to be parallel to the substrate surface 2a along the longitudinal direction in the y direction. The word line WL0 54_128 is provided above the bit line BL0 50_64 above the region 80_128 so as to be parallel to the substrate surface 2a along the longitudinal direction in the y direction.

In addition, the semiconductor storage device 100 includes bit lines BL1 60, BL1 52, and BL1 64 as the bit lines BL1. More specifically, the semiconductor storage device 100 includes bit lines BL1 60, BL1 52_0, BL1 52_1, ..., BL1 52_61, BL1 52_62, and BL1 64. Each of the bit lines BL1 52 is provided across the word lines WL0 provided above the two regions 80, in other words, each of the bit lines BL1 52 is provided so as to be parallel to the substrate surface 2a along the longitudinal direction in the x direction so as to straddle the word lines WL0 provided above the two regions. Herein, the bit line BL1 52, which is alternated with the bit line BL0 50, is provided across the two regions 80. The bit line BL1 60 is provided above the word line WL0 54_0 above the region 80_0 so as to be parallel to the substrate surface 2a along the longitudinal direction in the x direction. The bit line BL1 52_0 is provided above the word line WL0 54_1 above the region 80_1 and above the word line WL0 54_2 above the region 80_2 so as to be parallel to the substrate surface 2a along the longitudinal direction in the x direction. The bit line BL1 52_1 is provided above the word line WL0 54_3 above the region 80_3 and above the word line WL0 54_4 above the region 80_4 so as to be parallel to the substrate surface 2a along the longitudinal direction in the x direction. The bit line BL1 52_61 is provided above the word line WL0 54_123 above the region 80_123 and on the word line WL0 54_124 above the region 80_124 so as to be parallel to the substrate surface 2a along the longitudinal direction in the x direction. The bit line BL1 52_62 is provided above the word line WL0 54_125 above the region 80_125 and above the word line WL0 54_126 above the region 80_126 so as to be parallel to the substrate surface 2a along the longitudinal direction in the x direction. The bit line BL1 64 is provided above the word line WL0 54_127 above the region 80_127 and above the word line WL0 54_128 above the region 80_128 so as to be parallel to the substrate surface 2a along the longitudinal direction in the x direction. In addition, each of the bit lines BL1 60, BL1 52, and BL1 64 is provided so as to be passed by a second virtual line parallel to the x direction. In FIG. 6A, for the convenience of illustration, for example, only one bit line BL1 60 is illustrated. However, actually, a plurality of the bit lines BL1 60 are provided side by side in the y direction. The same applies to other bit lines BL1.

The memory cell array MCA0 includes a lower layer memory cell 70_0 and an upper layer memory cell 72_0. The memory cells 70_0 are provided between the bit line BL0 50_0 and the word line WL0 54_0, respectively. The memory cells 72_0 are provided between the word line WL0 54_0 and the bit line BL1 60, respectively, and overlap the memory cells 70_0 when viewed from the above, respectively.

The memory cell array MCAT includes a lower layer memory cell 70_1 and an upper layer memory cell 72_1. The memory cells 70_1 are provided between the bit line BL0 50_0 and the word line WL0 54_1, respectively. The memory cells 72_1 are provided between the word line WL0 54_1 and the bit line BL1 52_0, respectively, and overlap the memory cells 70_0 when viewed from the above, respectively.

The memory cell array MCA2 includes a lower layer memory cell 70_2 and an upper layer memory cell 72_2. The memory cells 70_2 are provided between the bit line BL0 50_1 and the word line WL0 54_2, respectively. The memory cells 72_2 are provided between the word line WL0 54_2 and the bit line BL1 52_0, respectively, and overlap the memory cells 70_2 when viewed from the above, respectively.

The memory cell array MCA3 includes a lower layer memory cell 70_3 and an upper layer memory cell 72_3. Memory cells 70_3 are provided between the bit line BL0 50_1 and the word line WL0 54_3, respectively. The memory cells 72_3 are provided between the word line WL0 54_3 and the bit line BL1 52_1, respectively, and overlap the memory cells 70_3 when viewed from the above, respectively.

The memory cell array MCA124 includes a lower layer memory cell 70_124 and an upper layer memory cell 72_124. Memory cells 70_124 are provided between the bit line BL0 50_62 and the word line WL0 54_124, respectively. The memory cells 72_124 are provided between the word line WL0 54_124 and the bit line BL1 52_61, respectively, and overlap the memory cells 70_124 when viewed from the above, respectively.

The memory cell array MCA125 includes a lower layer memory cell 70_125 and an upper layer memory cell 72_125. Memory cells 70_125 are provided between the bit line BL0 50_62 and the word line WL0 54_125, respectively. The memory cells 72_125 are provided between the word line WL0 54_125 and the bit line BL1 52_62, respectively, and overlap the memory cells 70_125 when viewed from the above, respectively.

The memory cell array MCA126 includes a lower layer memory cell 70_126 and an upper layer memory cell 72_126. The memory cells 70_126 are provided between the bit line BL0 50_63 and the word line WL0 54_126, respectively. The memory cells 72_126 are provided between the word line WL0 54_126 and the bit line BL1 52_62, respectively, and overlap the memory cells 70_126 when viewed from the above, respectively.

The memory cell array MCA127 includes a lower layer memory cell 70_127 and an upper layer memory cell 72_127. The memory cells 70_127 are provided between the bit line BL0 50_63 and the word line WL0 54_127, respectively. The memory cells 72_127 are provided between the word line WL0 54_127 and the bit line BL1 64, respectively, and overlap the memory cells 70_127 when viewed from the above, respectively.

The memory cell array MCA128 includes a lower layer memory cell 70_128 and an upper layer memory cell 72_128. The memory cells 70_128 are provided between the bit line BL0 50_64 and the word line WL0 54_128, respectively. The memory cells 70_128 are provided between the word line WL0 54_128 and the bit line BL1 64, respectively, and overlap the memory cells 70_128 when viewed from the above, respectively.

As described above, in the semiconductor storage device 100 according to the embodiment, the memory cell arrays MCA provided above the respective regions 80 and adjacent to each other share the bit line BL0 50 or BL1 52, and thus, the memory cell arrays MCA are connected by the bit line BL0 50 or BL1 52. For example, the memory cell array MCA0 provided above the region 80_0 and the memory cell array MCA1 provided above the region 80_1 share the bit line BL0 50_0 as the bit line BL0 and are connected to each other by the bit line BL0 50_0. In addition, the memory cell array MCA1 provided above the region 80_1 and the memory cell array MCA2 provided above the region 80_2 share the bit line BL1 52_0 as the bit line BL1 and are connected to each other by the bit line BL1 52_0.

A multiplexer 4_0 is provided on the substrate 2 under the bit line BL0 50_0. A plurality of connection wirings 40_0 connect the bit line BL0 50_0 and the multiplexer 4_0, respectively. A multiplexer 6_0 is provided on the substrate 2 under the bit line BL1 52_0. A plurality of connection wirings 42_0 connect the bit line BL1 52_0 and the multiplexer 6_0, respectively. A multiplexer 4_1 is provided on the substrate 2 under the bit line BL0 50_1. A plurality of connection wirings 40_1 connect the bit line BL1 50_1 and the multiplexer 4_1, respectively. A multiplexer 4_62 is provided on the substrate 2 under the bit line BL0 50_62. A plurality of connection wirings 40_62 connect the bit line BL0 50_62 and the multiplexer 4_62, respectively. A multiplexer 6_62 is provided on the substrate 2 under the bit line BL1 52_62. A plurality of connection wirings 42_62 connect the bit line BL1 52_62 and the multiplexer 6_62, respectively. A multiplexer 4_63 is provided on the substrate 2 under the bit line BL0 50_63. A plurality of connection wirings 40_63 connect the bit line BL0 50_63 and the multiplexer 4_63, respectively. A multiplexer 6_63 is provided on the substrate 2 under the bit line BL1 64. A plurality of connection wirings 42_63 connect the bit line BL1 64 and the multiplexer 6_63, respectively.

A multiplexer 10_0 is provided on the substrate 2 and is connected to the word line WL0 54_0. A multiplexer 10_1 is provided on the substrate 2 and is connected to the word line WL0 54_1. A multiplexer 10_2 is provided on the substrate 2 and is connected to the word line WL0 54_2. A multiplexer 10_3 is provided on the substrate 2 and is connected to the word line WL0 54_3. A multiplexer 10_4 is provided on the substrate 2 and is connected to the word line WL0 54_4. A multiplexer 10_5 is provided on the substrate 2 and is connected to the word line WL0 54_5. Similarly, a multiplexer 10_6, a multiplexer 10_7, . . . , and a multiplexer 10_128 are provided on the substrate 2, respectively, and are connected to the word lines WL0 54_6, WL0 54_7, . . . , and WL0 54_128, respectively.

For example, the multiplexer 10_0 is provided on the substrate 2 between the memory cell array MCA0 of the half bank 110a and the memory cell array MCA0 of the half bank 110b. The multiplexer 10_1 is provided on the substrate 2 between the memory cell array MCA1 of the half bank 110a and the memory cell array MCA1 of the half bank 110b. The multiplexer 10_2 is provided on the substrate 2 between the memory cell array MCA2 of the half bank 110a and the memory cell array MCA2 of the half bank 110b. The multiplexer 10_3 is provided on the substrate 2 between the memory cell array MCA3 of the half bank 110a and the memory cell array MCA3 of the half bank 110b. The multiplexer 10_4 is provided on the substrate 2 between the memory cell array MCA4 of the half bank 110a and the memory cell array MCA4 of the half bank 110b. For example, the same applies to other multiplexers 10.

Then, the word line WL0 54_0 can be shared between the memory cell array MCA0 of the half bank 110a and the memory cell array MCA0 of the half bank 110b. The word line WL0 54_1 can be shared between the memory cell array MCA1 of the half bank 110a and the memory cell array MCA1 of the half bank 110b. The word line WL0 54_2 can be shared between the memory cell array MCA2 of the half bank 110a and the memory cell array MCA2 of the half bank 110b. The word line WL0 54_3 can be shared between the memory cell array MCA3 of the half bank 110a and the memory cell array MCA3 of the half bank 110b. The word line WL0 54_4 can be shared between the memory cell array MCA4 of the half bank 110a and the memory cell array MCA4 of the half bank 110b. The same applies to other word lines WL0 54.

For example, the memory cell 70_0, the memory cell 70_1, the memory cell 72_1, and the memory cell 72_2 are treated as memory cells of the same slice. In addition, the memory cell 70_124, the memory cell 70_125, the memory cell 72_125, and the memory cell 72_126 are treated as memory cells of the same slice. In addition, the memory cell 70_126, the memory cell 70_127, the memory cell 72_127, and the memory cell 72_128 are treated as memory cells belonging to the same slice. That is, when k is an odd number of from 1 to 127 (1, 3, 5, . . . , 121, 123, 127), the memory cell 70 (k−1), the memory cell 70_k, the memory cell 72_k, and the memory cell 72 (k+1) is treated as memory cells of the same slice. In each of the 64 slices, the memory cell 70 (k−1) and the memory cell 70_k directly share the bit line 50 [(k−1)/2] of the bit line BL0 layer, and the memory cell 72_k and the memory cell 72 (k+1) directly share the bit line 52 [(k−1)/2] of the bit line BL1 layer.

In this manner, the memory cells from the memory cell 70_0 to the memory cell 72_128 constitute 64 slices. For example, one-bit data is read from each slice by one reading operation. Similarly, for example, one-bit data is written into each slice in one writing operation. It is noted that the number of slices included in the semiconductor storage device 100 is not limited to 64. The semiconductor storage device 100 may have 32, 64, 128 or 256 slices, for example, according to the required operating specifications.

Herein, for the memory cell 70_128 that does not belong to any of the slices, an unselected potential VSS is applied from the multiplexer 14 provided on the substrate 2 via a connection wiring 40_64. In addition, for the memory cell 72_0 that does not belong to any of the slices, an unselected potential VSS is applied from the multiplexer 12 provided on the substrate 2 via a connection wiring 62 and the bit line BL1 60. Accordingly, the memory cell 70_128 and the memory cell 72_0 are not used for the writing operation and the reading operation of the half bank 110a.

Figure 11:
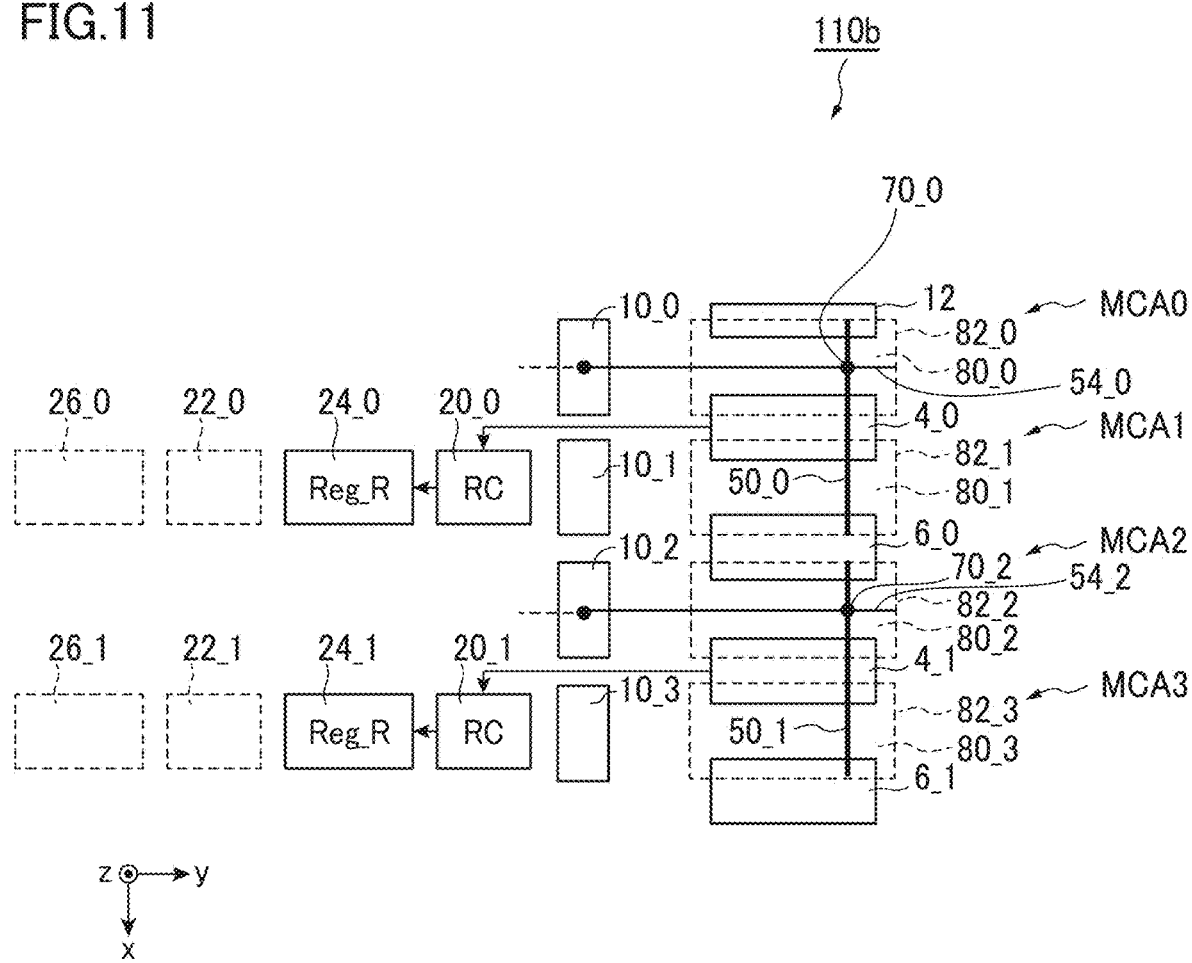
FIG. 11 is a schematic view illustrating an example of operations of a semiconductor storage device in a comparative form.

FIG. 11 is a schematic view illustrating an example of operations of the semiconductor storage device 100 in a comparative form. FIG. 11 illustrates an example of a reading operation on the memory cell provided between the word line WL0 and the bit line BL0 among the memory cells belonging to each of the above-described slices.

A writing circuit 22_0, . . . , a writing circuit 22_62, and a writing circuit 22_63 are provided on the substrate 2. The writing circuit 22_0 is connected to the multiplexer 4_0 and the multiplexer 6_0. Similarly, the writing circuit 22_62 is connected to the multiplexer 4_62 and the multiplexer 6_62. The writing circuit 22_63 is connected to the multiplexer 4_63 and the multiplexer 6_63.

A reading circuit 20_0, . . . , a reading circuit 20_62, and a reading circuit 20_63 are provided on the substrate 2. The reading circuit 20_0 is connected to the multiplexer 4_0 and the multiplexer 6_0. Similarly, the reading circuit 20_62 is connected to the multiplexer 4_62 and the multiplexer 6_62. The reading circuit 20_63 is connected to the multiplexer 4_63 and the multiplexer 6_63.

The writing circuit 22 and the reading circuit 20 correspond to, for example, the sense amplifier SA illustrated in FIG. 2.

A write register 26_0, a write register 26_1, . . . , a write register 26_62, and a write register 26_63 are provided on the substrate 2. The write register 26_0 is connected to the multiplexer 10_0, the multiplexer 10_1, and the multiplexer 10_2. The write register 26_62 is connected to the multiplexer 10_124, the multiplexer 10_125, and the multiplexer 10_126. The write register 26_63 is connected to the multiplexer 10_126, the multiplexer 10_127 and the multiplexer 10_128.

A read register 24_0, a read register 24_1, . . . , a read register 24_62, and a read register 24_63 are provided on the substrate 2. The read register 24_0 is connected to the reading circuit 20_0. Similarly, the read register 24_62 is connected to the reading circuit 20_62. The read register 24_63 is connected to the reading circuit 20_63.

Herein, as the comparative form, an example of the reading operation on the memory cell provided between the bit line BL0 and the word line WL0 among the memory cells belonging to each of the above-mentioned slices for the half bank 110b is illustrated.

With respect to the slices of the memory cell 70_0, the memory cell 70_1, the memory cell 72_1, and the memory cell 72_2, an example of the operations in the case of performing reading from the memory cell 70_0 will be described. The specific WL0 54_0 of the memory cell array MCA provided above the region 80_0 is selected by using the multiplexer 10_0. In addition, the specific BL0 50_0 of the memory cell array MCA provided above the region 80_0 is selected by using the multiplexer 4_0. Then, reading is performed on the specific memory cell 70_0 provided between the selected specific WL0 54_0 and the selected specific BL0 50_0 described above by using the reading circuit 20_0 connected to the multiplexer 4_0. The reading result is stored in the read register 24_0. It is noted that, in the case of performing writing into the memory cell 70_1, the multiplexer 10_1 is used instead of the multiplexer 10_0.

With respect to the slices of the memory cell 70_2, the memory cell 70_3, the memory cell 72_3, and the memory cell 72_4, an example of the operations in the case of performing reading from the memory cell 70_2 will be described. The specific WL0 54_2 of the memory cell array MCA provided above the region 80_2 is selected by using the multiplexer 10_2. In addition, the specific BL0 50_1 of the memory cell array MCA provided above the region 80_0 is selected by using the multiplexer 4_1. Then, reading is performed on the specific memory cell 70_2 provided between the selected specific WL0 54_2 and the selected specific BL0 50_1 described above by using the reading circuit 20_0 connected to the multiplexer 4_1. The reading result is stored in the read register 24_0. It is noted that, in the case of performing writing into the memory cell 70_3, the multiplexer 10_3 is used instead of the multiplexer 10_2.

Figure 12:
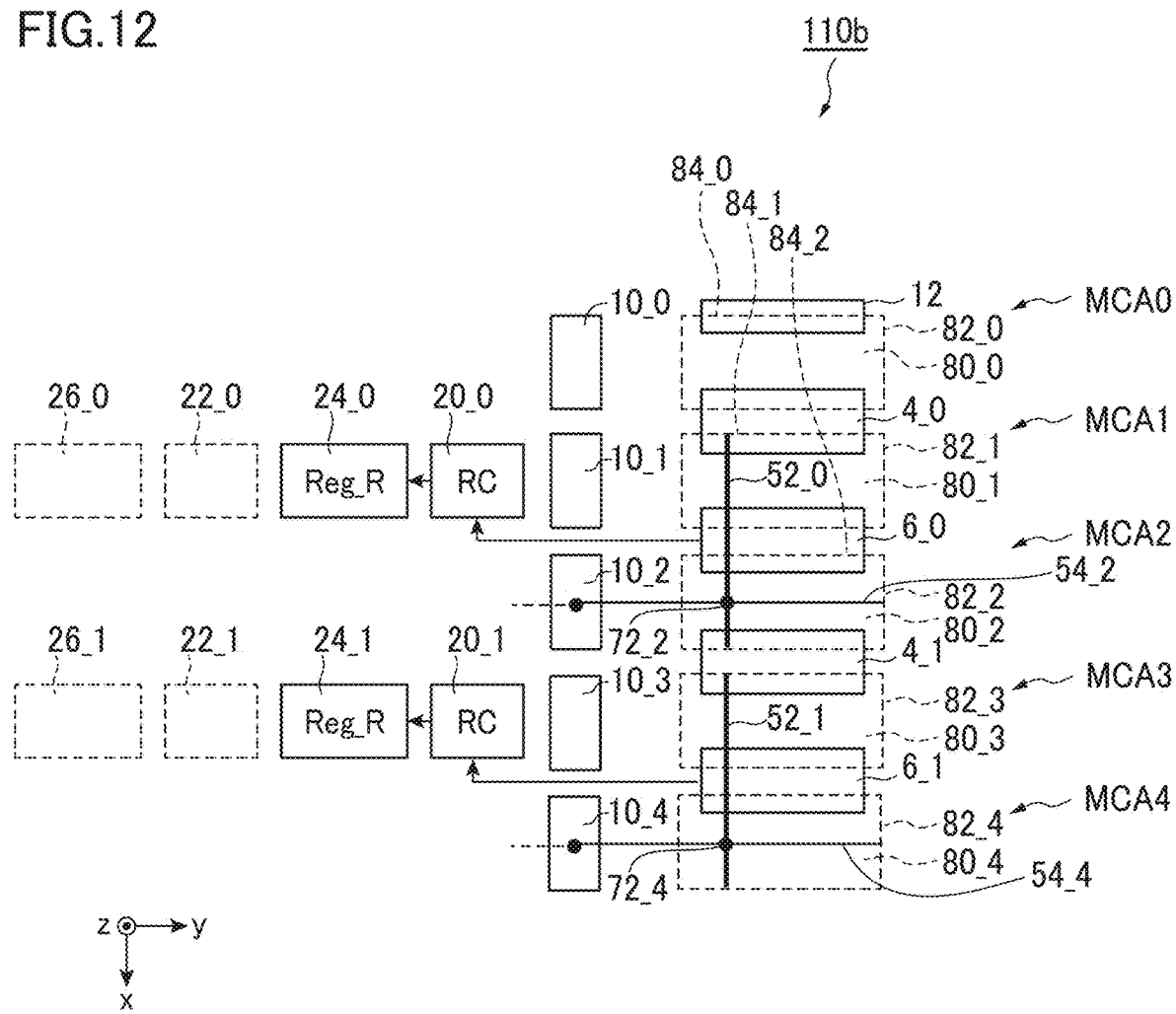
FIG. 12 is a schematic diagram illustrating an example of the operations of the semiconductor storage device in the comparative form.

FIG. 12 is a schematic view illustrating an example of operations of the semiconductor storage device 100 in the comparative form. FIG. 12 illustrates an example of a reading operation for the memory cell provided between the word line WL0 and the bit line BL1 among the memory cells belonging to each of the above-described slices.

With respect to the slices of the memory cell 70_0, the memory cell 70_1, the memory cell 72_1, and the memory cell 72_2, an example of the operations in a case where reading is performed from the memory cell 72_2 will be described. The specific WL0 54_2 of the memory cell array MCA provided above the region 80_2 is selected by using the multiplexer 10_2. In addition, the specific BL0 52_0 of the memory cell array MCA provided above the region 80_2 is selected by using the multiplexer 6_0. Then, reading is performed on the specific memory cell 72_2 provided between the selected specific WL0 54_2 and the selected specific BL0 52_0 described above by using the reading circuit 20_0 connected to the multiplexer 6_0. The reading result is stored in the read register 24_0. It is noted that, in the case of performing writing into the memory cell 72_1, the multiplexer 10_1 is used instead of the multiplexer 10_2.

With respect to the slices of the memory cell 70_2, the memory cell 70_3, the memory cell 72_3, and the memory cell 72_4, an example of the operations in a case where reading is performed from the memory cell 72_4 will be described. The specific WL0 54_4 of the memory cell array MCA provided above the region 80_4 is selected by using the multiplexer 10_4. In addition, the specific BL0 52_1 of the memory cell array MCA provided above the region 80_4 is selected by using the multiplexer 6_1. Then, reading is performed on the specific memory cell 72_4 provided between the selected specific WL0 54_4 and the selected specific BL0 52_1 described above by using the reading circuit 20_1 connected to the multiplexer 6_1. The reading result is stored in the read register 24_1. It is noted that, in the case of performing writing into the memory cell 72_3, the multiplexer 10_3 is used instead of the multiplexer 10_4.

Figure 13:
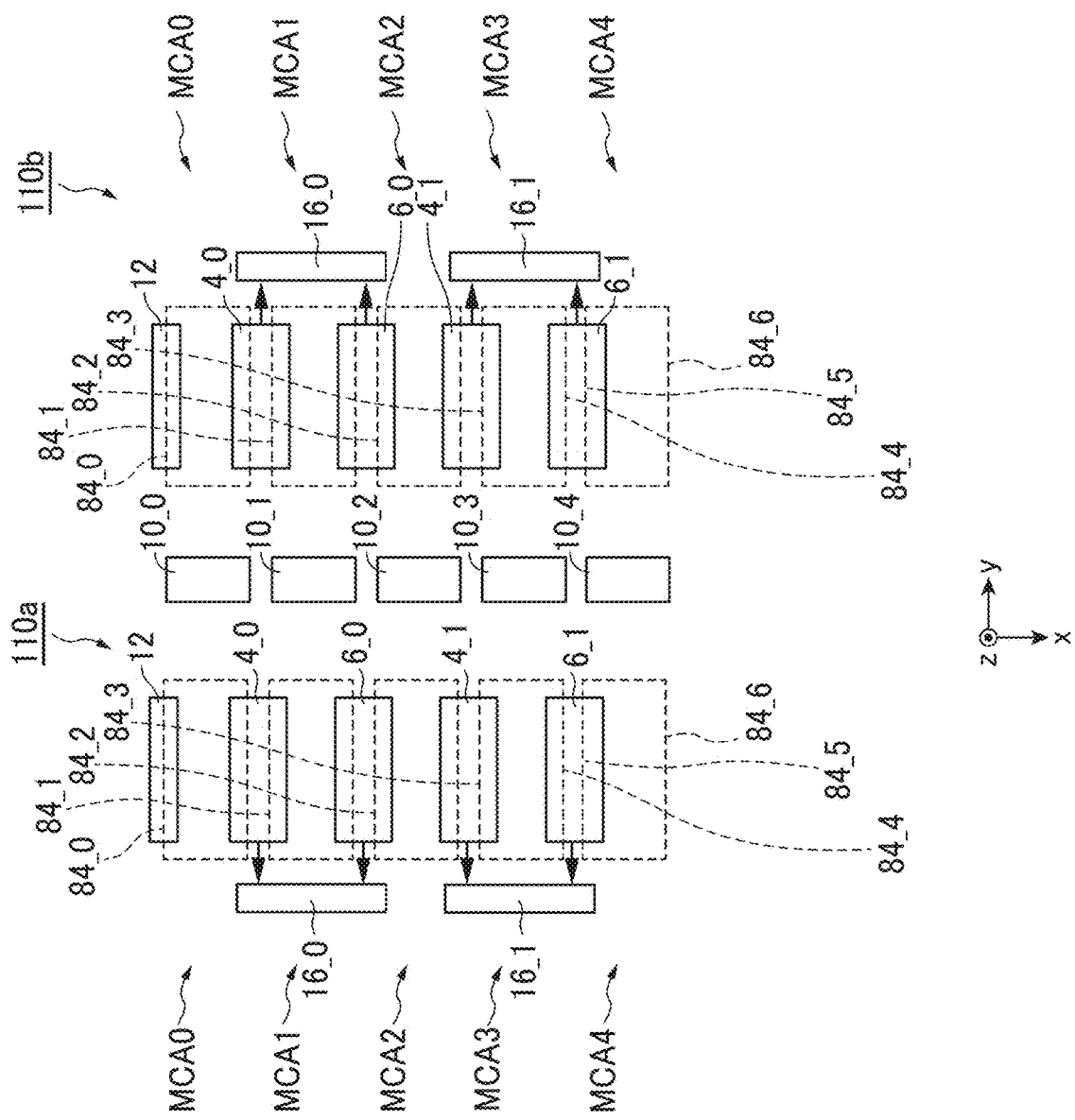
FIG. 13 is a schematic view illustrating another example of main components of the semiconductor storage device in the comparative form.

FIG. 13 is a schematic view illustrating another example of main components of the semiconductor storage device in the comparative form. The multiplexer 16_0 is connected to the multiplexer 4_0 and the multiplexer 6_0. The multiplexer 16_1 is connected to the multiplexer 4_1 and the multiplexer 6_1. Similarly, for example, the multiplexer 16_63 is connected to the multiplexer 4_63 and the multiplexer 6_63. The multiplexer 16 connects the reading circuit 20 and the multiplexer selected from any one of the multiplexer 4 and the multiplexer 6. It is noted that the multiplexer 16 may not be provided.

As described above, in the semiconductor storage device of the comparative form, reading is performed from the memory cell 70 provided between the bit line BL0 and the word line WL0, or reading is performed from the memory cell 72 provided between the word line WL0 and the bit line BL1. In other words, reading is performed from the memory cell of the layer (one layer) under the word line WL0, or reading is performed from the memory cell of the layer (the other layer) on the word line WL0. For example, in the bank 120 (FIG. 8), in both the half bank 110 and the half bank 112, reading is performed from the memory cell 70 provided between the bit line BL0 and the word line WL0, or reading is performed from the memory cell 72 provided between the word line WL0 and the bit line BL1.

In contrast, in the semiconductor storage device according to the embodiment, for example, in the half bank 110, reading is performed from the memory cell 70 (an example of the memory cell of the one layer) provided between the bit line BL0 and the word line WL0, and in the half bank 112, reading is performed from the memory cell 72 (an example of the memory cell of the other layer) provided between the word line WL0 and the bit line BL1. It is noted that, on the contrary, for example, in the half bank 110, reading may be performed from the memory cell 72 provided between the bit line BL0 and the word line WL0, and in the half bank 112, reading may be performed from the memory cell 70 provided between the word line WL0 and the bit line BL1.

Furthermore, for example, in the half bank 110a, reading may be performed from the memory cell 70 provided between the bit line BL0 and the word line WL0, in the half bank 112a, reading may be from the memory cell 72 provided between the word line WL0 and the bit line BL1, in the half bank 110b, reading may be performed from the memory cell 72 provided between the word line WL0 and the bit line BL1, and in the half bank 112b, reading may be performed from the memory cell 70 provided between the word line WL0 and the bit line BL0. That is, which of the lower layer memory cell 70 and the upper layer memory cell 72 of each of the half bank 110 and the half bank 112 reading is performed from may be switched according to the bank that is a reading operation target.

An error occurs at a certain rate in the data stored in the memory cell. The error may depend on the layer in which the memory cell is provided. For example, the bit error rate may differ between the memory cell 70 provided between the bit line BL0 and the word line WL0 and the memory cell 72 provided between the word line WL0 and the bit line BL1. For example, in general, in the manufacturing process of a semiconductor storage device, the memory cell array MCA is formed in order from the side closer to the substrate 2, like formation of the bit line BL0, after that, formation of the memory cell 70, after that, formation of the word line WL0, after that, formation of the memory cell 72, and after that, formation of the bit line BL1. For example, it is considered that the (lower layer) memory cell formed on the side closer to the substrate has a relatively high flatness of the formed surface. In contrast, it is considered that the (upper layer) memory cell formed on the side farther from the substrate has a relatively low flatness of the formed surface. In contrast, in some cases, the bit error rate may be higher. The memory cells provided at the same distance from the substrate 2 are basically produced in the same processing step, and thus, the characteristics of the memory cells are likely to be uniform, so that the bit error rates are also likely to be uniform. Therefore, in some cases, the (upper layer) memory cell formed on the side farther from the substrate may have a higher bit error rate than the (lower layer) memory cell formed on the side closer to the substrate.

For example, case where the bit error rate of the memory cell 72 is low and the bit error rate of the memory cell 70 is high is considered. In this case, when reading is performed from only the memory cell 72 on all the slices that are access targets in one reading operation, the bit error rate of the read data is assumed to be low. On the other hand, when reading is performed from only the memory cell 70 on all the slices that are access targets in one reading operation, the bit error rate of the read data is assumed to be high. In order to realize smooth operations of the memory system 400 as a whole, the ECC circuit 222 needs to be configured so as to be able to detect and correct the errors of data even in a case where the highest bit error rate in the assumed range is high (worst case). That is, the function required for the ECC circuit 222 is determined by the highest bit error rate (worst case) in the assumed range. Therefore, as the bit error rate assumed in the worst case becomes higher, the ECC circuit 222 (FIG. 1) having the larger chip area and/or the larger power consumption is required. In addition, the time required for correction by the ECC circuit 222 is lengthened.

In contrast, according to the semiconductor storage device according to the embodiment, among all the slices that are access targets in one reading operation, reading is performed from the memory cell 70 on the half of the slices, and reading is performed from the memory cell 72 on the other half of the slices. In this case, the data read by one reading operation includes data having a low bit error rate and data having a high bit error rate. Accordingly, the bit error rate as a whole in the data read by one reading operation can be lowered as compared with the case of performing reading from only the memory cell 70. Herein, the bit error rate may be higher than that the case of performing reading from only the memory cell 72. However, as described above, as the bit error rate assumed as the worst case becomes higher, the ECC circuit 222 having the larger the chip area and the larger the power consumption is required. According to the semiconductor storage device according to the embodiment, since the bit error rate assumed as the worst case can be lowered in the data read by one reading operation, the smooth operation of the memory system 400 as a whole can be implemented only by preparing the ECC circuit 222 having a small chip area and small power consumption as compared with the case where the semiconductor storage device of the comparative form is used.

According to the semiconductor storage device according to the embodiment, it is possible to provide a semiconductor storage device having a low bit error rate. Alternatively, the equivalent bit error rate can be implemented with the smaller chip area, the smaller power consumption, and/or the shorter operating time.

Second Embodiment

FIG. 3 will be described as an example. For example, in the semiconductor storage device 3a which is one chip, reading is performed from the memory cell 70 (memory cell of one layer) provided between the bit line BL0 and the word line WL0 by using the memory controller 290. On the other hand, for example, in the semiconductor storage device 3d which is one chip, reading is performed from the memory cell 72 (memory cell of the other layer) provided between the word line WL0 and the bit line BL1. Accordingly, it is possible to reduce the bit error rate assumed for the entire memory system 400 (FIG. 1). This is an example in which reading is performed from a memory cell having a different physical address in each semiconductor storage device 3.

In addition, with respect to each semiconductor storage device 3, reading may also be performed from the memory cells having different logical addresses even though the memory cells have the same physical address. This is because, during repeating reading and writing, the bit error rate may differ between the semiconductor storage device 3a and the semiconductor storage device 3d even though the memory cells have the same physical address. For example, it is considered that, during repeating reading and writing, the bit error rate of the memory cell 70 provided between the bit line BL0 and the word line WL0 of the semiconductor storage device 3a is deteriorated, whereas the bit error rate of the memory cell 70 provided between the bit line BL0 and the word line WL0 of the semiconductor storage device 3d is not greatly deteriorated. In this case, different types of the logical addresses are assigned to the memory cell 70 provided between the bit line BL0 and the word line WL0 of the semiconductor storage device 3a and the memory cell 70 provided between the bit line BL0 and the word line WL0 of the semiconductor storage device 3d. Then, reading is performed from the memory cell 70 provided between the bit line BL0 and the word line WL0 of the semiconductor storage device 3a and the memory cell 70 provided between the bit line BL0 and the word line WL0 of the semiconductor storage device 3d by using the memory controller 290. This is an example in which reading is performed from a memory cell having a different logical address in each semiconductor storage device 3. The logical/physical address mapping table is stored in, for example, the logical/physical address mapping table storage memory 242 (FIG. 1).

It is noted that each semiconductor storage device 3 may have a different logical/physical address mapping table.

According to the semiconductor storage device according to the embodiment, it is possible to provide a semiconductor storage device having a low bit error rate. Alternatively, equivalent bit error rates can be achieved with smaller chip area, smaller power consumption, and/or shorter operating times.

Third Embodiment

A semiconductor storage device according to an embodiment includes: a substrate (substrate 2) having a substrate surface extending in a first direction and a second direction intersecting the first direction; a plurality of first wirings (for example, BL0 50_0), each of the first wirings being provided above a rectangular shaped first region (for example, a region 80_0) of the substrate surface and above a rectangular shaped second region (for example, a region 80_1) of the substrate surface, the first region having a first side parallel to the first direction and a second side intersecting the first side and parallel to the second direction, the second region having a third side parallel to the first direction and a fourth side intersecting the third side and parallel to the second direction, the second region being provided adjacent to the first region in the first direction, and the first wirings being provided so that a longitudinal direction of each of the first wirings is provided along the first direction; a plurality of second wirings (for example, BL0 50_1), each of the second wirings being provided above a rectangular shaped third region (for example, a region 80_2) of the substrate surface and above a rectangular shaped fourth region (for example, a region 80_3) of the substrate surface, the third region having a fifth side parallel to the first direction and a sixth side intersecting the fifth side and parallel to the second direction, the fourth region having a seventh side parallel to the first direction and an eighth side intersecting the seventh side and parallel to the second direction, the fourth region being provided adjacent to the third region in the first direction, the second wirings being provided so that a longitudinal direction of each of the second wirings is provided along the first direction, the second wirings being passed by a plurality of first virtual lines together with the first wirings, respectively, and the third region being provided between the second region and the fourth region; a plurality of third wirings (for example, BL0 50_2) provided above a rectangular shaped fifth region (for example, a region 80_4) of the substrate surface, the fifth region having a ninth side parallel to the first direction and a tenth side intersecting the ninth side and parallel to the second direction, the third wirings being provided so that a longitudinal direction of each of the third wirings is provided along the first direction, the third wirings being passed by the first virtual lines together with the first wirings and the second wirings, respectively, and the fourth region being provided between the third region and the fifth region; a plurality of fourth wirings (for example, WL0 54_0) provided above the first wirings above the first region, and the fourth wirings being provided so that a longitudinal direction of each of the fourth wirings is provided along the second direction; a plurality of fifth wirings (for example, WL0 54_1) provided above the first wirings above the second region, and the fifth wirings being provided so that a longitudinal direction of each of the fifth wirings is provided along the second direction; a plurality of sixth wirings (for example, WL0 54_2) provided above the second wirings above the third region, and the sixth wirings being provided so that a longitudinal direction of each of the sixth wirings is provided along the second direction; a plurality of seventh wirings (for example, WL0 54_3) provided above the second wirings above the fourth region, and the seventh wirings being provided so that a longitudinal direction of each of the seventh wirings is provided along the second direction; a plurality of eighth wirings (for example, WL0 54_4) provided above the third wirings above the fifth region, and the eighth wirings being provided so that a longitudinal direction of each of the eighth wirings is provided along the second direction; a plurality of ninth wirings (for example, BL1 52_0), each of the ninth wirings being provided above the fifth wirings and above the sixth wirings, the ninth wirings overlapping the first wirings and the second wirings, respectively, when viewed from the above, and the ninth wirings being provided so that a longitudinal direction of the ninth wirings is provided along the first direction; a plurality of tenth wirings (for example, BL1 52_1), each of the tenth wirings being provided above the seventh wirings and above the eighth wirings, the tenth wirings overlapping the second wirings and the third wirings, respectively, when viewed from the above, and the tenth wirings being provided so that a longitudinal direction of the tenth wirings is provided along the first direction; a plurality of first memory cells (for example, memory cell 70_0) provided between the first wirings and the fourth wirings, respectively; a plurality of second memory cells (for example, memory cell 70_1)

provided between the first wirings and the fifth wirings, respectively; a plurality of third memory cells (for example, memory cell 72_1) provided between the fifth wirings and the ninth wirings, respectively, and the third memory cells overlapping the second memory cells, respectively, when viewed from the above; a plurality of fourth memory cells (for example, memory cell 70_2) provided between the second wirings and the sixth wirings, respectively; a plurality of fifth memory cells (for example, memory cell 72_2) provided between the sixth wirings and the ninth wirings, respectively, and the fifth memory cells overlapping the fourth memory cells, respectively, when viewed from the above; a plurality of sixth memory cells (for example, memory cell 70_3) provided between the second wirings and the seventh wirings, respectively; a plurality of seventh memory cells (for example, memory cell 72_3) provided between the seventh wirings and the tenth wirings, respectively, and the seventh memory cells overlapping the sixth memory cells, respectively, when viewed from the above; a plurality of eighth memory cells (for example, memory cell 72_4) provided between the eighth wirings and the tenth wirings, respectively; a first multiplexer (for example, multiplexer 4_0) provided on the substrate under the first wirings and the first multiplexer being connected to the first wirings; a second multiplexer (for example, multiplexer 6_0) provided on the substrate under the ninth wirings and the second multiplexer being connected to the ninth wirings; a third multiplexer (for example, multiplexer 4_1) provided on the substrate under the second wirings and the third multiplexer being connected to the second wirings; a fourth multiplexer (for example, multiplexer 6_1) provided on the substrate under the tenth wirings and the fourth multiplexer being connected to the tenth wirings; a fifth multiplexer (for example, multiplexer 10_0) connected to the fourth wirings and provided on the substrate; a sixth multiplexer (for example, multiplexer 10_1) connected to the fifth wirings and provided on the substrate; a seventh multiplexer (for example, multiplexer 10_2) connected to the sixth wirings and provided on the substrate; an eighth multiplexer (for example, multiplexer 10_3) connected to the seventh wirings and provided on the substrate; a ninth multiplexer (for example, multiplexer 10_4) connected to the eighth wirings and provided on the substrate; a tenth multiplexer (for example, multiplexer 10_4) connected to the first, second, third and fourth multiplexers; a first reading circuit (for example, a reading circuit 20_0) connected to the tenth multiplexer; and a second reading circuit (for example, a reading circuit 20_1) connected to the tenth multiplexer, wherein the first reading circuit and the second reading circuit: when performing first reading from one of the first memory cells by using the first multiplexer and the fifth multiplexer and when performing the first reading from one of the second memory cells by using the first multiplexer and the sixth multiplexer, perform second reading from one of the seventh memory cells by using the fourth multiplexer and the eighth multiplexer or perform the second reading from one of the eighth memory cells by using the fourth multiplexer and the ninth multiplexer; and when performing the first reading from one of the third memory cells by using the second multiplexer and the sixth multiplexer and when performing the first reading from one of the fifth memory cells by using the second multiplexer and the seventh multiplexer, perform the second reading from one of the fourth memory cells by using the third multiplexer and the seventh multiplexer or perform the second reading from one of the sixth memory cells by using the third multiplexer and the eighth multiplexer.

Herein, the contents overlapping those of the first embodiment and the second embodiment will be omitted in description.

Figure 14:
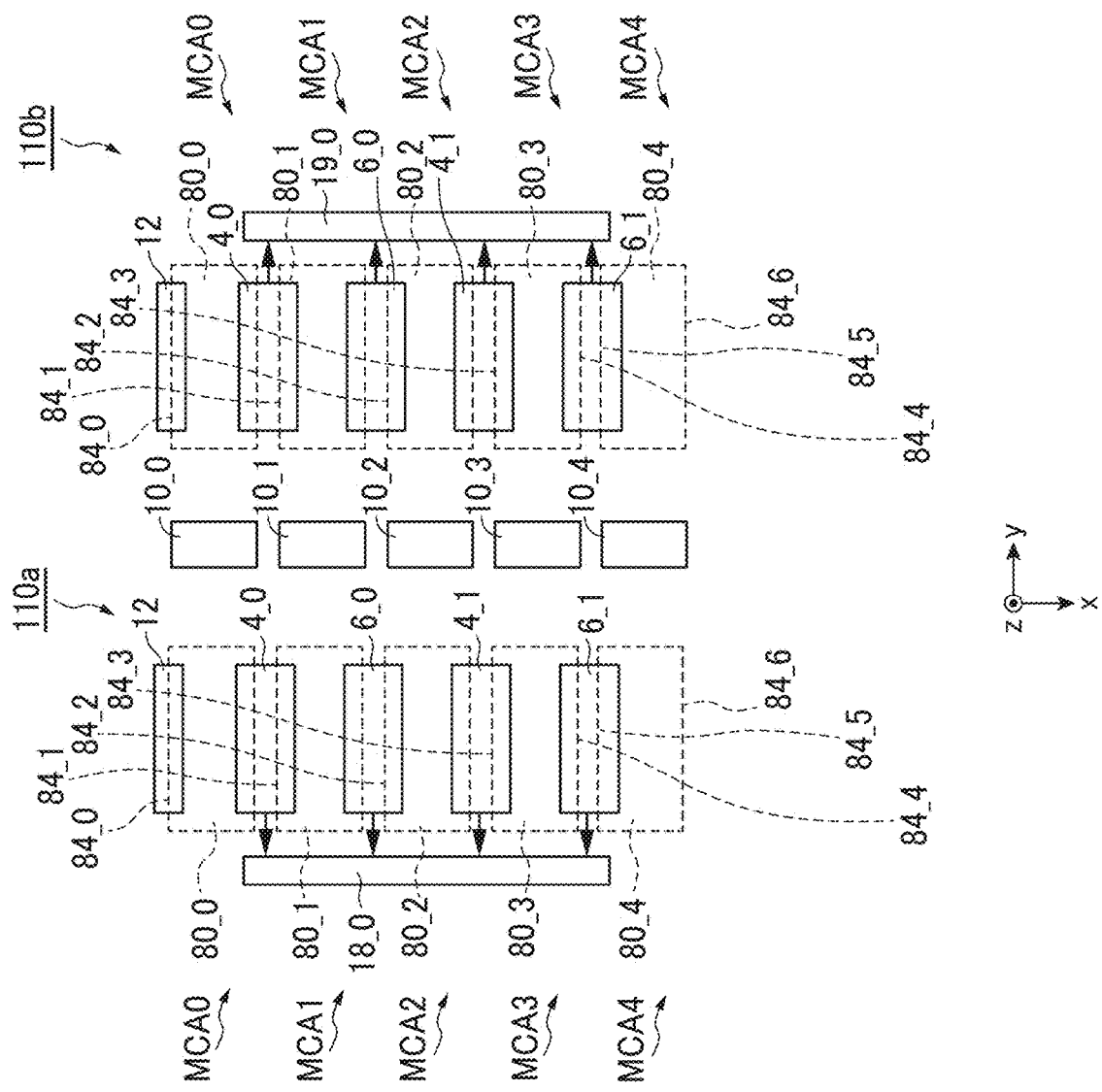
FIG. 14 is a schematic view illustrating main components of a semiconductor storage device according to a third embodiment.

FIG. 14 is a schematic view illustrating main components of the semiconductor storage device according to the embodiment. A multiplexer 18_0 is connected to the multiplexer 4_0, the multiplexer 6_0, the multiplexer 4_1, and the multiplexer 6_1 of the half bank 110*a*. The multiplexer 18_0 is connected to the reading circuit 20_0 and the reading circuit 20_1 (not illustrated in FIG. 14). That is, the multiplexer 18_0 is connected to a multiplexer 4 and a multiplexer 6 related to the operations of the slices of the memory cell 70_0, the memory cell 70_1, the memory cell 72_1, and the memory cell 72_2 and the slices of the memory cell 70_2, the memory cell 70_3, the memory cell 72_3, and the memory cell 72_3. It is noted that, similarly, the multiplexer 18 is assumed to be connected to the other multiplexer 4 and the other multiplexer 6 in the half bank 110*a*.

Similarly, with respect to the half bank 110*b*, the multiplexer 19_0 is connected to the multiplexer 4_0, the multiplexer 6_0, the multiplexer 4_1 and the multiplexer 6_1. It is noted that, similarly, the multiplexer 19 is assumed to be connected to the other multiplexer 4 and the other multiplexer 6 in the half bank 110*b*.

In addition, similarly, the multiplexer 18 or the multiplexer 19 may be connected to the other half bank 110 and the half bank 112.

Figure 15:
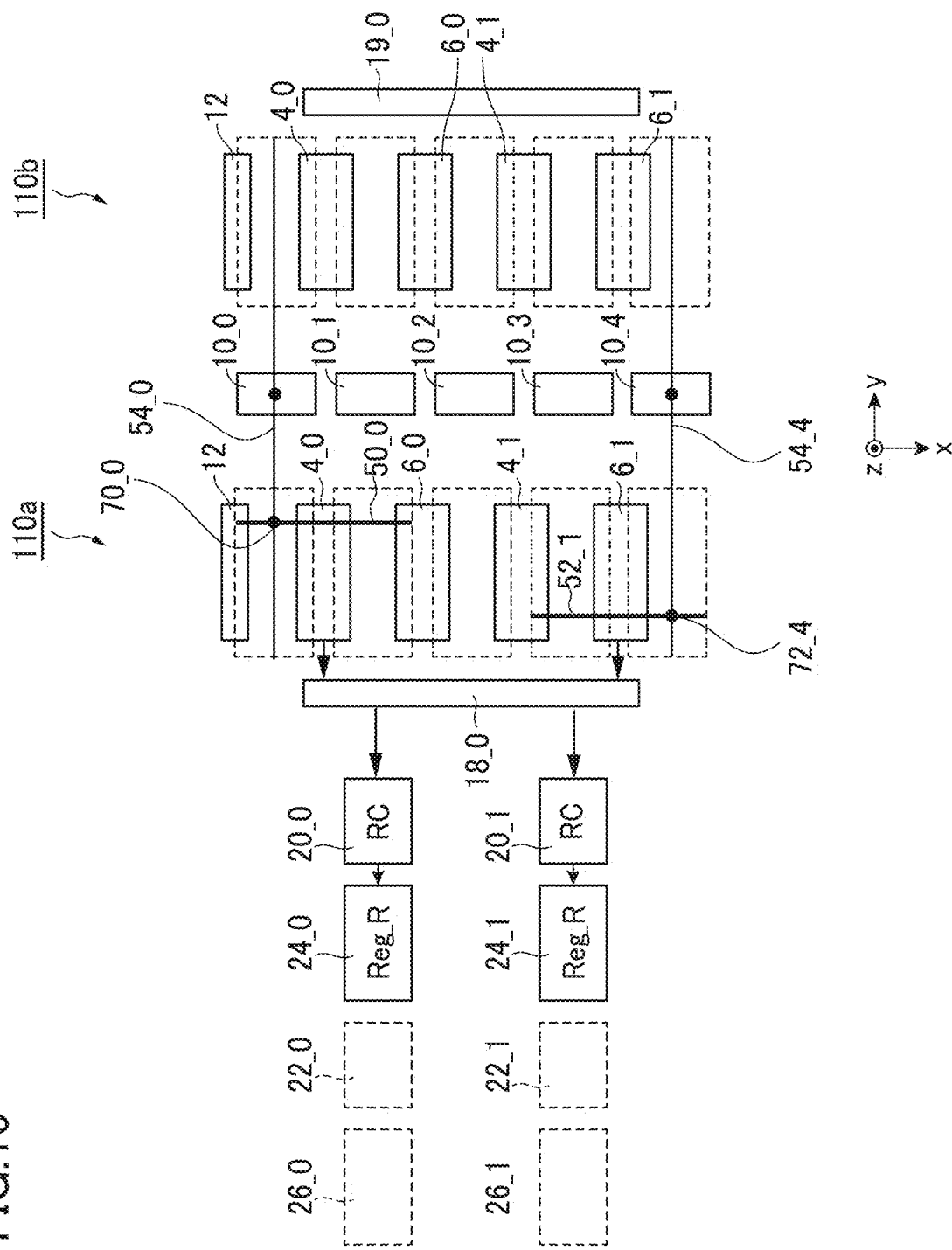
FIG. 15 is a schematic view illustrating an example of operations of the semiconductor storage device according to the third embodiment.

FIG. 15 is a schematic view illustrating an example of operations of the semiconductor storage device according to the embodiment.

For example, reading is performed from the memory cell 70_0 on the slices of the memory cell 70_0, the memory cell 70_1, the memory cell 72_1, and the memory cell 72_2. A specific WL0 54_0 of the memory cell array MCA provided above the region 80_0 is selected by using the multiplexer 10_0. In addition, the specific BL0 50_0 of the memory cell array MCA provided above the region 80_0 is selected by using the multiplexer 4_0. Then, reading is performed on the specific memory cell 70_0 provided between the selected specific WL0 54_0 and the selected specific BL0 50_0 described above by using the reading circuit 20_0 connected to the multiplexer 4_0 via the multiplexer 18_0. The reading result is stored in the read register 24_0.

In contrast, for example, reading is performed from the memory cell 72_4 on the slices of the memory cell 70_2, the memory cell 70_3, the memory cell 72_3, and the memory cell 72_4. The specific WL0 54_4 of the memory cell array MCA provided above the region 80_4 is selected by using the multiplexer 10_4. In addition, the specific BL1 52_1 of the memory cell array MCA provided above the region 80_4 is selected by using the multiplexer 6_1. Then, reading is performed on the specific memory cell 72_4 provided between the selected specific WL0 54_4 and the selected specific BL1 52_1 described above by using the reading circuit 20_1 connected to the multiplexer 6_1 via the multiplexer 18_0. The reading result is stored in the read register 24_1.

That is, in a case where reading is performed from the memory cell 70 provided under the word line WL0 on the slices of the memory cell 70_0, the memory cell 70_1, the memory cell 72_1, and the memory cell 72_2, reading is performed from the memory cell 72 provided on the word line WL on the slice of the memory cell 70_2, the memory cell 70_3, the memory cell 72_3, and the memory cell 72_4. In addition, in the case of performing reading from the memory cell 72 provided on the word line WL0 on the slices of the memory cell 70_0, the memory cell 70_1, the memory cell 72_1, and the memory cell 72_2, reading is performed from the memory cell 70 provided under the word line WL on the slices of the memory cell 70_2, the memory cell 70_3, the memory cell 72_3, and the memory cell 72_4.

In the semiconductor storage device according to the first embodiment, it has been determined whether to perform reading from the memory cell of one layer or perform reading from the memory cell of the other layer in units of a half bank. In addition, in the semiconductor storage device according to the second embodiment, it has been determined whether to perform reading from the memory cell of one layer or perform reading from the memory cell of the other layer in units of each semiconductor storage device (chip). In contrast, according to the semiconductor storage device according to the embodiment, it is possible to determine whether to perform reading from the memory cell 70 or to perform reading from the memory cell 72 in units of each slice. For this reason, it is possible to accurately control the bit error rate focusing on the bit error rate of each memory cell.

According to the semiconductor storage device according to the embodiment, it is possible to provide a semiconductor storage device having a low bit error rate. Alternatively, equivalent bit error rates can be achieved with smaller chip area, smaller power consumption, and/or shorter operating times.

Fourth Embodiment

A semiconductor storage device according to an embodiment includes: a substrate (a substrate 2) having a substrate surface extending in a first direction and a second direction intersecting the first direction; a plurality of first wirings (for example, BL0 50_0 of a half bank 110*a*), each of the first wirings being provided above a rectangular shaped first region (for example, BL0 50_0 of a half bank 110*a*) of the substrate surface and above a rectangular shaped second region (for example, a region 80_1 of the half bank 110*a*) of the substrate surface, the first region having a first side parallel to the first direction and a second side intersecting the first side and parallel to the second direction, the second region having a third side parallel to the first direction and a fourth side intersecting the third side and parallel to the second direction, the second region being provided adjacent to the first region in the first direction, and the first wirings being provided so that a longitudinal direction of each of the first wirings is provided along the first direction; a plurality of second wirings (for example, BL0 50_1 of the half bank 110*a*), each of the second wirings being provided above a rectangular shaped third region (for example, a region 80_2 of the half bank 110*a*) of the substrate surface and above a rectangular shaped fourth region (for example, a region 80_3 of the half bank 110*a*) of the substrate surface, the third region having a fifth side parallel to the first direction and a sixth side intersecting the fifth side and parallel to the second direction, the fourth region having a seventh side parallel to the first direction and an eighth side intersecting the seventh side and parallel to the second direction, the fourth region being provided adjacent to the third region in the first direction, the second wirings being provided so that a longitudinal direction of each of the second wirings is provided along the first direction, the second wirings being passed by a plurality of first virtual lines together with the first wirings, respectively, the third region being provided between the second region and the fourth region; a plurality of third wirings (for example, BL0 50_2 of the half bank 110*a*) provided above a rectangular shaped fifth region (for example, a region 80_4 of the half bank 110*a*) of the substrate surface, the fifth region having a ninth side parallel to the first direction and a tenth side intersecting the ninth side and parallel to the second direction, the third wirings being provided so that a longitudinal direction of each of the third wirings is provided along the first direction, the third wirings being passed by the first virtual lines together with the first wirings and the second wirings, respectively, and the fourth region being provided between the third region and the fifth region; a plurality of fourth wirings (for example, WL0 54_0), each of the fourth wirings being provided above the first wirings above the first region and above a rectangular shaped sixth region (for example, a region 80_0 of a half bank 110*b*) of the substrate surface adjacent to the first region in the second direction, the sixth region having an eleventh side parallel to the first direction and a twelfth side intersecting the eleventh side and parallel to the second direction, and the fourth wirings being provided so that a longitudinal direction of each of the fourth wirings is provided along the second direction; a plurality of fifth wirings (for example, WL0 54_1), each of the fifth wirings being provided above the first wirings above the second region and above a rectangular shaped seventh region (for example, a region 80_1 of the half bank 110*b*) of the substrate surface adjacent to the second region in the second direction, the seventh region having a thirteenth side parallel to the first direction and a fourteenth side intersecting the thirteenth side and parallel to the second direction, and the fifth wirings being provided so that a longitudinal direction of each of the fifth wirings is provided along the second direction; a plurality of sixth wirings (for example, WL0 54_2), each of the sixth wirings being provided above the second wirings above the third region and above a rectangular shaped eighth region (for example, a region 80_2 of the half bank 110*b*) of the substrate surface adjacent to the third region in the second direction, the eighth region having a fifteenth side parallel to the first direction and a sixteenth side intersecting the fifteenth side and parallel to the second direction, and the sixth wirings being provided so that a longitudinal direction of each of the sixth wirings is provided along the second direction; a plurality of seventh wirings (for example, WL0 54_3), each of the seventh wirings being provided above the second wirings above the fourth region and above a rectangular shaped ninth region (for example, WL0 54_3) of the substrate surface adjacent to the fourth region in the second direction, the ninth region having a seventeenth side parallel to the first direction and an eighteenth side intersecting the seventeenth side and parallel to the second direction, and the seventh wirings being provided so that a longitudinal direction of each of the seventh wirings is provided along the second direction; a plurality of eighth wirings (for example, WL0 54_4), each of the eighth wirings being provided above the third wirings above the fifth region and above a rectangular shaped tenth region (for example, a region 80_4 of the half bank 110*b*) of the substrate surface adjacent to the fifth region in the second direction, the tenth region having a nineteenth side parallel to the first direction and a twentieth side intersecting the nineteenth side and parallel to the second direction, and the eighth wirings being provided so that a longitudinal direction of each of the eighth wirings is provided along the second direction; a plurality of ninth wirings (for example, a region 80_4 of the half bank 110*b*), each of the ninth wirings being provided above the fifth wirings above the second region and above the sixth wirings above the third region, the ninth wirings overlapping the first wirings and the second wirings, respectively, when viewed from the above, and the ninth wirings being provided so that a longitudinal direction of each of the ninth wirings is provided along the first direction; a plurality of tenth wirings (for example, BL1 52_1 of the half bank 110*a*) provided above the seventh wirings above the fourth region and above the eighth wirings above the fifth region, the tenth wirings overlapping the second wirings and the third wirings, respectively, when viewed from the above, the tenth wirings being passed by a plurality of second virtual lines together with the ninth wirings, respectively, and the tenth wirings being provided so that a longitudinal direction of each of the tenth wirings is provided along the first direction; a plurality of eleventh wirings (for example, BL0 50_1 of the half bank 110*b*) provided above the seventh region and the eighth region and under the fifth wirings and the sixth wirings, the eleventh wirings being provided so that a longitudinal direction of each of the eleventh wirings is provided along the first direction; a plurality of twelfth wirings (for example, BL0 50_2 of the half bank 110*b*) provided above the ninth region and the tenth region and under the seventh wirings and the eighth wirings, the twelfth wirings being provided so that a longitudinal direction of each of the twelfth wirings is provided along the first direction, and the twelfth wirings being passed by a plurality of third virtual lines together with the eleventh wirings, respectively; a plurality of thirteenth wirings (for example, BL1 52_0 of the half bank 110*b*) provided above the fourth wirings above the sixth region and above the fifth wirings above the seventh region, the thirteenth wirings overlapping the eleventh wirings, respectively, when viewed from the above, and the thirteenth wirings being provided so that a longitudinal direction of each of the thirteenth wirings is provided along the first direction; a plurality of fourteenth wirings (for example, BL1 52_1 of the half bank 110*b*) provided above the sixth wirings above the eighth region and above the seventh wirings above the ninth region, the fourteenth wirings overlapping the eleventh wirings and the twelfth wirings, respectively, when viewed from the above, the fourteenth wirings being passed by a plurality of fourth virtual lines together with the thirteenth wirings, respectively, and the fourteenth wirings being provided so that a longitudinal direction of each of the fourteenth wirings is provided along the first direction; a plurality of first memory cells (for example, a memory cell 70_0 of the half bank 110*a*) provided between the first wirings and the fourth wirings, respectively; a plurality of second memory cells (for example, a memory cell 70_1 of the half bank 110*a*) provided between the first wirings and the fifth wirings, respectively; a plurality of third memory cells (for example, a memory cell 72_1 of the half bank 110*a*) provided between the fifth wirings and the ninth wirings, respectively, and the third memory cells overlapping the second memory cells, respectively, when viewed from the above; a plurality of fourth memory cells (for example, a memory cell 70_2 of the half bank 110*a*) provided between the second wirings and the sixth wirings, respectively; a plurality of fifth memory cells (for example, a memory cell 72_2 of the half bank 110*a*) provided between the sixth wirings and the ninth wirings, respectively, and the fifth memory cells overlapping the fourth memory cells, respectively, when viewed from the above; a plurality of sixth memory cells (for example, a memory cell 70_3 of the half bank 110*a*) provided between the second wirings and the seventh wirings, respectively; a plurality of seventh memory cells (for example, a memory cell 72_3 of the half bank 110*a*) provided between the seventh wirings and the tenth wirings, respectively, and the seventh memory cells overlapping the sixth memory cells, respectively, when viewed from the above; a plurality of eighth memory cells (for example, a memory cell 72_4 of the half bank 110*a*) provided between the eighth wirings and the tenth wirings, respectively; a plurality of ninth memory cells (for example, a memory cell 72_4 of the half bank 110*a*) provided between the fourth wirings and the thirteenth wirings, respectively; a plurality of tenth memory cells (for example, a memory cell 70_1 of the half bank 110*b*) provided between the eleventh wirings and the fifth wirings, respectively; a plurality of eleventh memory cells (for example, a memory cell 72_1 of the half bank 110*b*) provided between the fifth wirings and the thirteenth wirings, respectively, and the eleventh memory cells overlapping the tenth memory cells, respectively, when viewed from the above; a plurality of twelfth memory cells (for example, a memory cell 70_2 of the half bank 110*b*) provided between the eleventh wirings and the sixth wirings, respectively; a plurality of thirteenth memory cells (for example, a memory cell 72_2 of the half bank 110*b*) provided between the sixth wirings and the fourteenth wirings, respectively, and the thirteenth memory cells overlapping the twelfth memory cells, respectively, when viewed from the above; a plurality of fourteenth memory cells (for example, a memory cell 70_3 of the half bank 110*b*) provided between the twelfth wirings and the seventh wirings, respectively; a plurality of fifteenth memory cells (for example, a memory cell 70_3 of the half bank 110*b*) provided between the seventh wirings and the fourteenth wirings, respectively, and the fifteenth memory cells overlapping the fourteenth memory cells, respectively, when viewed from the above; a plurality of sixteenth memory cells (for example, a memory cell 70_4 of the half bank 110*b*) provided between the twelfth wirings and the eighth wirings, respectively; a first multiplexer (for example, a multiplexer 4_0 of the half bank 110*a*) provided on the substrate under the first wirings, and the first multiplexer being connected to the first wirings; a second multiplexer (for example, a multiplexer 6_0 of the half bank 110*a*) provided on the substrate under the ninth wirings, and the second multiplexer being connected to the ninth wirings; a third multiplexer (for example, a multiplexer 4_1 of the half bank 110*a*) provided on the substrate under the second wirings, and the third multiplexer being connected to the second wirings; a fourth multiplexer (for example, a multiplexer 6_1 of the half bank 110*a*) provided on the substrate under the tenth wirings, and the fourth multiplexer being connected to the tenth wirings; a fifth multiplexer (for example, a multiplexer 6_1 of the half bank 110*a*) connected to the fourth wirings and provided on the substrate; a sixth multiplexer (for example, a multiplexer 10_1) connected to the fifth wirings and provided on the substrate; a seventh multiplexer (for example, a multiplexer 10_2) connected to the sixth wirings and provided on the substrate; an eighth multiplexer (for example, a multiplexer 10_3) connected to the seventh wirings and provided on the substrate; a ninth multiplexer (for example, a multiplexer 10_4) connected to the eighth wirings and provided on the substrate; a tenth multiplexer (for example, a multiplexer 18) connected to the first, second, third and fourth multiplexers; an eleventh multiplexer (for example, a multiplexer 6_0 of the half bank 110*b*) provided on the substrate under the thirteenth wirings, and the eleventh multiplexer being connected to the thirteenth wirings; a twelfth multiplexer (for example, a multiplexer 4_0 of the half bank 110*b*) provided on the substrate under the eleventh wirings, and the twelfth multiplexer being connected to the eleventh wirings; a thirteenth multiplexer (for example, a multiplexer 6_1 of the half bank 110*b*) provided on the substrate under the fourteenth wirings, and the thirteenth multiplexer being connected to the fourteenth wirings; a fourteenth multiplexer (for example, a multiplexer 4_1 of the half bank 110*b*) provided on the substrate under the twelfth wirings, and the fourteenth multiplexer being connected to the twelfth wirings; a fifteenth multiplexer (for example, a multiplexer 19) connected to the eleventh, twelfth, thirteenth, and fourteenth multiplexers; a first reading circuit (for example, a reading circuit 20_0) connected to the tenth and fifteenth multiplexers; and a second reading circuit (for example, a reading circuit 20_1) connected to the tenth and fifteenth multiplexers, wherein the first reading circuit and the second reading circuit: perform first reading from the first memory cell and second reading from the ninth memory cell by using the first, fifth, and eleventh multiplexers, perform the first reading from the second memory cell and the second reading from the eleventh memory cell by using the first, sixth, and eleventh multiplexers, perform the first reading from the third memory cell and the second reading from the tenth memory cell by using the second, sixth, and twelfth multiplexers, perform the first reading from the fifth memory cell and the second reading from the twelfth memory cell by using the second, seventh, and twelfth multiplexers, perform the first reading from the fourth memory cell and the second reading from the thirteenth memory cell by using the third, seventh, and thirteenth multiplexers, perform the first reading from the sixth memory cell and the second reading from the fifteenth memory cell by using the third, eighth, and thirteenth multiplexers, perform the first reading from the seventh memory cell and the second reading from the fourteenth memory cell by using the fourth, eighth, and fourteenth multiplexers, or perform the first reading from the eighth memory cell and the second reading from the sixteenth memory cell by using the fourth, ninth, and fourteenth multiplexers.

The semiconductor storage device according to the embodiment is different from the semiconductor storage device according to the third embodiment in that, in the half bank 110 or half bank 112 that are adjacent to each other, the multiplexer 4 and the multiplexer 6 are provided adjacent to each other in the y direction. Herein, the description of the content overlapping the semiconductor storage device of the first to third embodiments is omitted.

Figure 16:
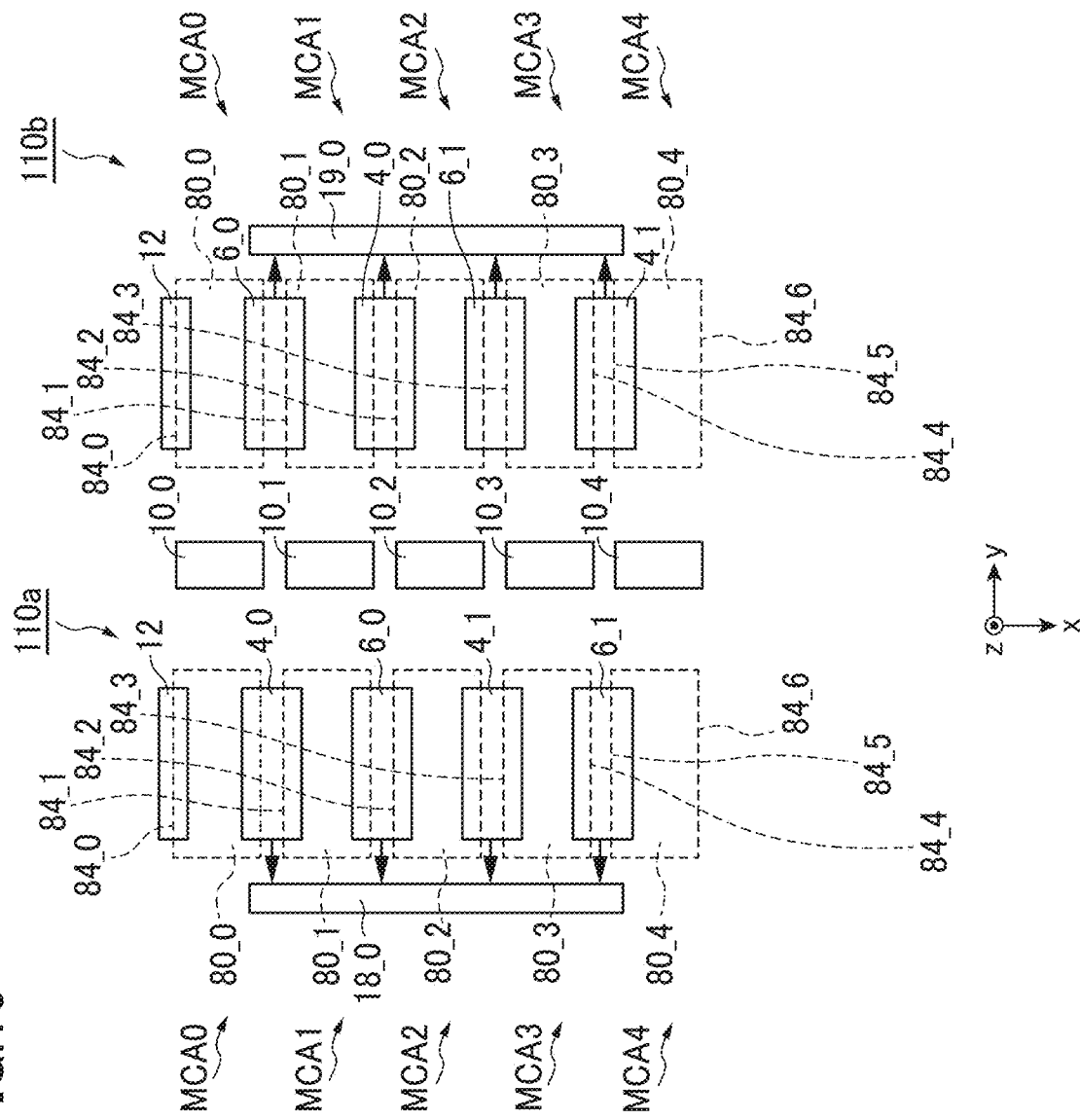
FIG. 16 is a schematic view illustrating main components of a semiconductor storage device according to a fourth embodiment.
Figure 17:
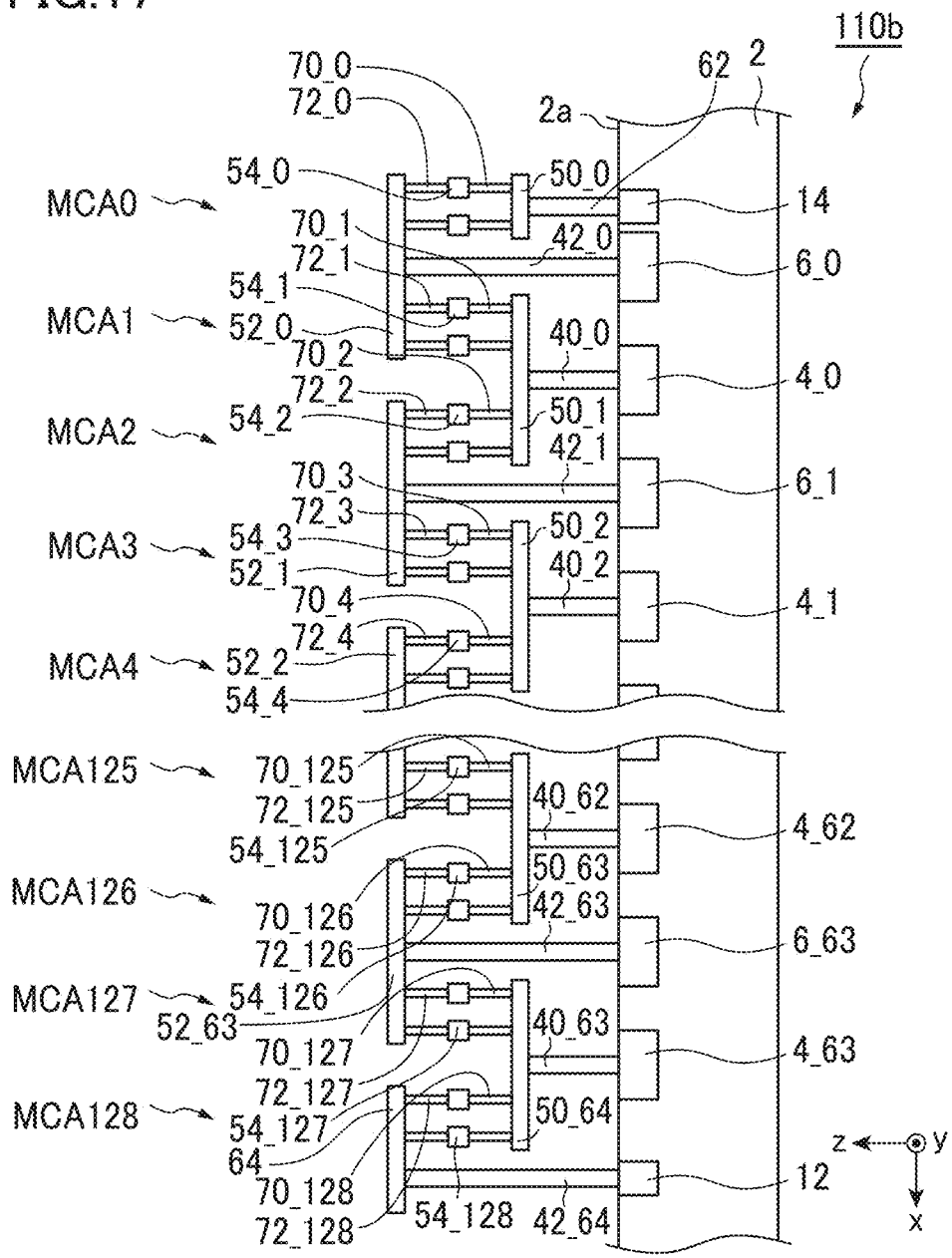
FIG. 17 is a schematic view illustrating main components of the semiconductor storage device according to the fourth embodiment.

FIG. 16 is a schematic view illustrating main components of the semiconductor storage device according to the embodiment. In the y direction, the multiplexer 4_0 of the half bank 110*a* and the multiplexer 6_0 of the half bank 110*b* are provided adjacent to each other. In the y direction, the multiplexer 6_0 of the half bank 110*a* and the multiplexer 4_0 of the half bank 110*b* are provided adjacent to each other. In the y direction, the multiplexer 4_1 of the half bank 110*a* and the multiplexer 6_1 of the half bank 110*b* are provided adjacent to each other. In the y direction, the multiplexer 6_1 of the half bank 110*a* and the multiplexer 4_1 of the half bank 110*b* are provided adjacent to each other. It is noted that FIG. 17 illustrates a schematic cross-sectional view inside the half bank 110*b* as a schematic view illustrating the main components of the semiconductor storage device according to the embodiment.

Figure 18:
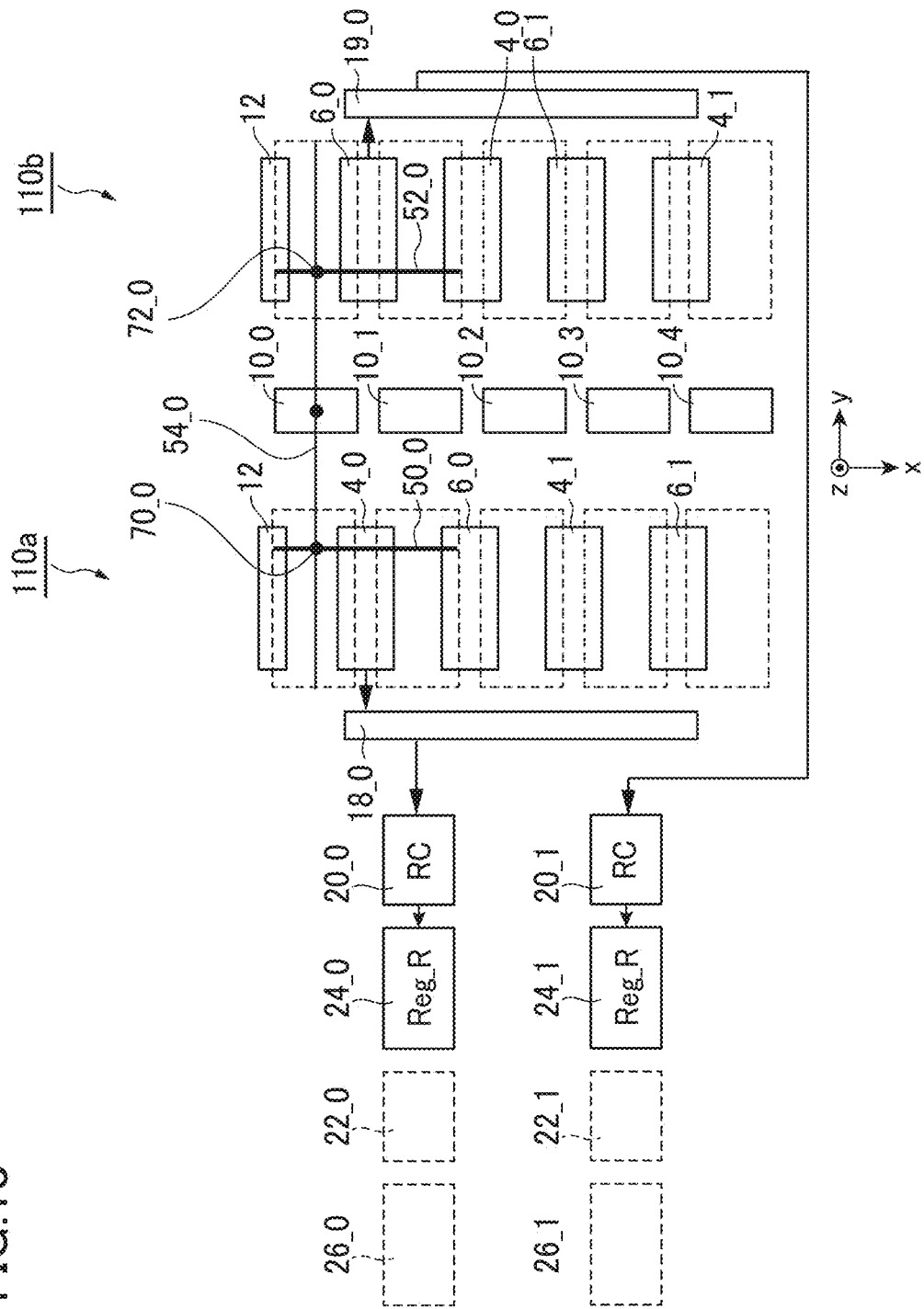
FIG. 18 is a schematic view illustrating an example of operations of the semiconductor storage device according to the fourth embodiment.

FIG. 18 is a schematic view illustrating an example of operations of the semiconductor storage device according to the embodiment. First, the word line WL0 54_0 shared between the memory cell array MCA0 of the half bank 110*a* and the memory cell array MCA0 of the half bank 110*b* is selected by using the multiplexer 10_0.

First, the operation in the half bank 110*a* will be described. The specific BL0 50_0 of the memory cell array MCA0 provided above the region 80_0 is selected by using the multiplexer 4_0. Then, reading is performed on the specific memory cell 70_0 provided between the selected specific WL0 54_0 and the selected specific BL0 50_0 described above by using the reading circuit 20_0 connected to the multiplexer 4_0 via the multiplexer 18_0. The reading result is stored in the read register 24_0.

Next, the operation in the half bank 110*b* will be described. The specific BL1 72 of the memory cell array MCA0 provided above the region 80_0 is selected by using the multiplexer 6_0. Then, reading is performed on the specific memory cell 72 provided between the selected specific WL0 54_0 and the selected specific BL1 72 described above by using the reading circuit 20_1 connected to the multiplexer 6_0 via the multiplexer 19_0. The reading result is stored in the read register 24_1.

It is noted that the multiplexer 4_0 in the half bank 110*a* and the reading circuit 20_1 may be connected, and the multiplexer 6_0 in the half bank 110*b* and the reading circuit 20_0 may be connected.

In the semiconductor storage device according to the embodiment, by using the configuration in which h the word line WL is shared between two adjacent half banks, reading is performed from the memory cell 70 (the memory cell of the one layer) in the one half bank 110*a* of the adjacent half banks, and reading is performed from the memory cell (the memory cell of the other layer) in the other half bank 110*b* of the adjacent half banks. Accordingly, it is possible to determine whether to perform reading from the memory cell of one layer or perform reading from the memory cell of the other layer in units of each slice by using two adjacent half banks. For this reason, it is possible to accurately control the bit error rate focusing on the bit error rate of each memory cell.

According to the semiconductor storage device according to the embodiment, it is possible to provide a semiconductor storage device having a low bit error rate. Alternatively, equivalent bit error rates can be achieved with smaller chip area, smaller power consumption, and/or shorter operating times.

In the embodiment described above, the memory cell 70 provided between the bit line BL0 and the word line WL0 and the memory cell 72 provided between the word line WL0 and the bit line BL1 are used. However, for example, an embodiment using the memory cell provided between the bit line BL1 and the word line WL1 and the memory cell provided between the word line WL1 and the bit line BL2 can also be considered. In such a case, by selecting the "memory cell of one layer" and the "memory cell of the other layer" from the memory cells in each layer between the bit line BL0 and the word line WL0, between the word line WL0 and the bit line BL1, between the bit line BL1 and the word line WL1, and between the word line WL1 and the bit line BL2, it is possible to provide a semiconductor storage device having a low bit error rate.

In the semiconductor storage device described in the embodiment, it is stated that, when the bit error rates are different among the memory cells of the layers, the configuration in which both the memory cells in the layers having a high bit error rate and the memory cells in the layers having a low bit error rate are selected to perform the data error detection and correction by the ECC circuit 222 is better than the configuration in which only the memory cells of the layers having a high bit error rate are selected to perform the data error detection and correction by the ECC circuit 222. The reason is that the load (the area occupied by the ECC circuit 222 in the memory controller 290, the power consumed by the ECC circuit 222, and the time consumed by the ECC circuit 222 in processing) of the ECC circuit 222 can be reduced as a whole.

While certain embodiments have been described, these embodiments have been presented by way of example only, and are not intended to limit the scope of the inventions. Indeed, semiconductor storage devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a substrate having a substrate surface extending in a first direction and a second direction intersecting the first direction;
a plurality of first region memory cells provided in a plurality of layers provided parallel to the substrate surface and in a third direction, the first region memory cells being provided above a rectangular shaped first region provided on the substrate surface, the first region having a first side parallel to the first direction and a second side parallel to the second direction when viewed from the third direction intersecting the first direction and the second direction;
a plurality of first region wirings provided between the first region memory cells;
a plurality of second region memory cells provided in the layers, the second region memory cells being provided above a rectangular shaped second region having a third side parallel to the first direction and a fourth side parallel to the second direction when viewed from the third direction;
a plurality of second region wirings provided between the second region memory cells; and
a control circuit capable of executing a reading operation,
wherein, in the reading operation, the control circuit performs reading from one of the first region memory cells provided in one of the layers and another one of the second region memory cells provided in another one of the layers.

2. The semiconductor storage device according to claim 1, wherein the one of the first region memory cells provided in the one of the layers and the another one of the first region memory cells provided in the other one of the layers have different physical addresses, respectively.

3. The semiconductor storage device according to claim 2, wherein the one of the first region memory cells provided in the one of the layers and the another one of the first region memory cells provided in the other one of the layers have different logical addresses, respectively.

4. The semiconductor storage device according to claim 1, wherein the first region wirings include:
a plurality of first wirings provided above the first region and provided so that a longitudinal direction of each of the first wirings is provided along the first direction;
a plurality of second wirings provided above the first wirings and provided so that a longitudinal direction of each of the second wirings is provided along the second direction; and
a plurality of third wirings provided above the second wirings, each of the third wirings overlapping each of the first wirings when viewed from the third direction, and the third wirings being provided so that a longitudinal direction of each of the third wirings is provided along the first direction,
wherein the first region memory cells include:
a plurality of first memory cells provided between the first wirings and the second wirings, respectively; and
a plurality of second memory cells provided between the second wirings and the third wirings, respectively, and each of the second memory cells overlapping each of the first memory cells when viewed from the third direction,
wherein the second region wirings include:
a plurality of fourth wirings provided above the second region and provided so that a longitudinal direction of each of the fourth wirings is provided along the first direction;
a plurality of fifth wirings provided above the fourth wirings and provided so that a longitudinal direction of each of the fifth wirings is provided along the second direction; and
a plurality of sixth wirings provided above the fifth wirings, each of the sixth wirings overlapping each of the fourth wirings when viewed from the third direction, and the sixth wirings being provided so that a longitudinal direction of each of the sixth wirings is provided along the first direction,
wherein the second region memory cells include:
a plurality of third memory cells provided between the fourth wirings and the fifth wirings, respectively; and
a plurality of fourth memory cells provided between the fifth wirings and the sixth wirings, respectively, and each of the fourth memory cells overlapping each of the third memory cells when viewed from the third direction, and
wherein the control circuit:
performs reading from one of the first memory cells and one of the fourth memory cells in the first reading operation; and
performs reading from one of the second memory cells and one of the third memory cells in the second reading operation.

5. The semiconductor storage device according to claim 1, wherein each of the first and second region memory cells includes:
a variable resistance element; and
a switch element.

6. The semiconductor storage device according to claim 1, wherein
the first region memory cells and the first region wirings form a first half bank,
the second region memory cells and the second region wirings form a second half bank,
the first half bank is provided in plurality along the first direction,
the second half bank is provided in plurality along the first direction, and
in the reading operation, the control circuit performs reading from the one of the first region memory cells provided in the one of the layers at one of the half banks and another one of the second region memory cells provided in another one of the layers at another one of the half banks, the one of the half banks and the another one of the half banks overlap when viewed in the second direction.

7. A semiconductor storage device comprising:

a substrate having a substrate surface extending in a first direction and a second direction intersecting the first direction;

a plurality of first wirings, each of the first wirings being provided above a rectangular shaped first region of the substrate surface and above a rectangular shaped second region of the substrate surface, the first region having a first side parallel to the first direction and a second side intersecting the first side and parallel to the second direction, the second region having a third side parallel to the first direction and a fourth side intersecting the third side and parallel to the second direction, the second region being provided adjacent to the first region in the first direction, and the first wirings being provided so that a longitudinal direction of each of the first wirings is provided along the first direction;

a plurality of second wirings, each of the second wirings being provided above a rectangular shaped third region of the substrate surface and above a rectangular shaped fourth region of the substrate surface, the third region having a fifth side parallel to the first direction and a sixth side intersecting the fifth side and parallel to the second direction, the fourth region having a seventh side parallel to the first direction and an eighth side intersecting the seventh side and parallel to the second direction, the fourth region being provided adjacent to the third region in the first direction, the second wirings being provided so that a longitudinal direction of each of the second wirings is provided along the first direction, the second wirings being passed by a plurality of first virtual lines together with the first wirings, respectively, and the third region being provided between the second region and the fourth region;

a plurality of third wirings provided above a rectangular shaped fifth region of the substrate surface, the fifth region having a ninth side parallel to the first direction and a tenth side intersecting the ninth side and parallel to the second direction, the third wirings being provided so that a longitudinal direction of each of the third wirings is provided along the first direction, the third wirings being passed by the first virtual lines together with the first wirings and the second wirings, respectively, and the fourth region being provided between the third region and the fifth region;

a plurality of fourth wirings provided above the first wirings above the first region, and the fourth wirings being provided so that a longitudinal direction of each of the fourth wirings is provided along the second direction;

a plurality of fifth wirings provided above the first wirings above the second region, and the fifth wirings being provided so that a longitudinal direction of each of the fifth wirings is provided along the second direction;

a plurality of sixth wirings provided above the second wirings above the third region, and the sixth wirings being provided so that a longitudinal direction of each of the sixth wirings is provided along the second direction;

a plurality of seventh wirings provided above the second wirings above the fourth region, and the seventh wirings being provided so that a longitudinal direction of each of the seventh wirings is provided along the second direction;

a plurality of eighth wirings provided above the third wirings above the fifth region, and the eighth wirings being provided so that a longitudinal direction of each of the eighth wirings is provided along the second direction;

a plurality of ninth wirings, each of the ninth wirings being provided above the fifth wirings and above the sixth wirings, the ninth wirings overlapping the first wirings and the second wirings, respectively, when viewed from the above, and the ninth wirings being provided so that a longitudinal direction of the ninth wirings is provided along the first direction;

a plurality of tenth wirings, each of the tenth wirings being provided above the seventh wirings and above the eighth wirings, the tenth wirings overlapping the second wirings and the third wirings, respectively, when viewed from the above, and the tenth wirings being provided so that a longitudinal direction of the tenth wirings is provided along the first direction;

a plurality of first memory cells provided between the first wirings and the fourth wirings, respectively;

a plurality of second memory cells provided between the first wirings and the fifth wirings, respectively;

a plurality of third memory cells provided between the fifth wirings and the ninth wirings, respectively, and the third memory cells overlapping the second memory cells, respectively, when viewed from the above;

a plurality of fourth memory cells provided between the second wirings and the sixth wirings, respectively;

a plurality of fifth memory cells provided between the sixth wirings and the ninth wirings, respectively, and the fifth memory cells overlapping the fourth memory cells, respectively, when viewed from the above;

a plurality of sixth memory cells provided between the second wirings and the seventh wirings, respectively;

a plurality of seventh memory cells provided between the seventh wirings and the tenth wirings, respectively, and the seventh memory cells overlapping the sixth memory cells, respectively, when viewed from the above;

a plurality of eighth memory cells provided between the eighth wirings and the tenth wirings, respectively;

a first multiplexer provided on the substrate under the first wirings and the first multiplexer being connected to the first wirings;

a second multiplexer provided on the substrate under the ninth wirings and the second multiplexer being connected to the ninth wirings;

a third multiplexer provided on the substrate under the second wirings and the third multiplexer being connected to the second wirings;

a fourth multiplexer provided on the substrate under the tenth wirings and the fourth multiplexer being connected to the tenth wirings;

a fifth multiplexer connected to the fourth wirings and provided on the substrate;

a sixth multiplexer connected to the fifth wirings and provided on the substrate;

a seventh multiplexer connected to the sixth wirings and provided on the substrate;

an eighth multiplexer connected to the seventh wirings and provided on the substrate;

a ninth multiplexer connected to the eighth wirings and provided on the substrate;

a tenth multiplexer connected to the first, second, third and fourth multiplexers;

a first reading circuit connected to the tenth multiplexer; and a second reading circuit connected to the tenth multiplexer, wherein the first reading circuit and the second reading circuit:
when performing first reading from one of the first memory cells by using the first multiplexer and the fifth multiplexer and when performing the first reading from one of the second memory cells by using the first multiplexer and the sixth multiplexer, perform second reading from one of the seventh memory cells by using the fourth multiplexer and the eighth multiplexer or perform the second reading from one of the eighth memory cells by using the fourth multiplexer and the ninth multiplexer; and
when performing the first reading from one of the third memory cells by using the second multiplexer and the sixth multiplexer and when performing the first reading from one of the fifth memory cells by using the second multiplexer and the seventh multiplexer, perform the second reading from one of the fourth memory cells by using the third multiplexer and the seventh multiplexer or perform the second reading from one of the sixth memory cells by using the third multiplexer and the eighth multiplexer.

8. The semiconductor storage device according to claim 7, wherein, when the first reading circuit performs the first reading, the second reading circuit performs the second reading, and
wherein, when the first reading circuit performs the second reading, the second reading circuit performs the first reading.

9. A semiconductor storage device comprising:
a substrate having a substrate surface extending in a first direction and a second direction intersecting the first direction;
a plurality of first wirings, each of the first wirings being provided above a rectangular shaped first region of the substrate surface and above a rectangular shaped second region of the substrate surface, the first region having a first side parallel to the first direction and a second side intersecting the first side and parallel to the second direction, the second region having a third side parallel to the first direction and a fourth side intersecting the third side and parallel to the second direction, the second region being provided adjacent to the first region in the first direction, and the first wirings being provided so that a longitudinal direction of each of the first wirings is provided along the first direction;
a plurality of second wirings, each of the second wirings being provided above a rectangular shaped third region of the substrate surface and above a rectangular shaped fourth region of the substrate surface, the third region having a fifth side parallel to the first direction and a sixth side intersecting the fifth side and parallel to the second direction, the fourth region having a seventh side parallel to the first direction and an eighth side intersecting the seventh side and parallel to the second direction, the fourth region being provided adjacent to the third region in the first direction, the second wirings being provided so that a longitudinal direction of each of the second wirings is provided along the first direction, the second wirings being passed by a plurality of first virtual lines together with the first wirings, respectively, the third region being provided between the second region and the fourth region;
a plurality of third wirings provided above a rectangular shaped fifth region of the substrate surface, the fifth region having a ninth side parallel to the first direction and a tenth side intersecting the ninth side and parallel to the second direction, the third wirings being provided so that a longitudinal direction of each of the third wirings is provided along the first direction, the third wirings being passed by the first virtual lines together with the first wirings and the second wirings, respectively, and the fourth region being provided between the third region and the fifth region;
a plurality of fourth wirings, each of the fourth wirings being provided above the first wirings above the first region and above a rectangular shaped sixth region of the substrate surface adjacent to the first region in the second direction, the sixth region having an eleventh side parallel to the first direction and a twelfth side intersecting the eleventh side and parallel to the second direction, and the fourth wirings being provided so that a longitudinal direction of each of the fourth wirings is provided along the second direction;
a plurality of fifth wirings, each of the fifth wirings being provided above the first wirings above the second region and above a rectangular shaped seventh region of the substrate surface adjacent to the second region in the second direction, the seventh region having a thirteenth side parallel to the first direction and a fourteenth side intersecting the thirteenth side and parallel to the second direction, and the fifth wirings being provided so that a longitudinal direction of each of the fifth wirings is provided along the second direction;
a plurality of sixth wirings, each of the sixth wirings being provided above the second wirings above the third region and above a rectangular shaped eighth region of the substrate surface adjacent to the third region in the second direction, the eighth region having a fifteenth side parallel to the first direction and a sixteenth side intersecting the fifteenth side and parallel to the second direction, and the sixth wirings being provided so that a longitudinal direction of each of the sixth wirings is provided along the second direction;
a plurality of seventh wirings, each of the seventh wirings being provided above the second wirings above the fourth region and above a rectangular shaped ninth region of the substrate surface adjacent to the fourth region in the second direction, the ninth region having a seventeenth side parallel to the first direction and an eighteenth side intersecting the seventeenth side and parallel to the second direction, and the seventh wirings being provided so that a longitudinal direction of each of the seventh wirings is provided along the second direction;
a plurality of eighth wirings, each of the eighth wirings being provided above the third wirings above the fifth region and above a rectangular shaped tenth region of the substrate surface adjacent to the fifth region in the second direction, the tenth region having a nineteenth side parallel to the first direction and a twentieth side intersecting the nineteenth side and parallel to the second direction, and the eighth wirings being provided so that a longitudinal direction of each of the eighth wirings is provided along the second direction;
a plurality of ninth wirings, each of the ninth wirings being provided above the fifth wirings above the second region and above the sixth wirings above the third region, the ninth wirings overlapping the first wirings and the second wirings, respectively, when viewed from the above, and the ninth wirings being provided so that a longitudinal direction of each of the ninth wirings is provided along the first direction;

a plurality of tenth wirings provided above the seventh wirings above the fourth region and above the eighth wirings above the fifth region, the tenth wirings overlapping the second wirings and the third wirings, respectively, when viewed from the above, the tenth wirings being passed by a plurality of second virtual lines together with the ninth wirings, respectively, and the tenth wirings being provided so that a longitudinal direction of each of the tenth wirings is provided along the first direction;

a plurality of eleventh wirings provided above the seventh region and the eighth region and under the fifth wirings and the sixth wirings, the eleventh wirings being provided so that a longitudinal direction of each of the eleventh wirings is provided along the first direction;

a plurality of twelfth wirings provided above the ninth region and the tenth region and under the seventh wirings and the eighth wirings, the twelfth wirings being provided so that a longitudinal direction of each of the twelfth wirings is provided along the first direction, and the twelfth wirings being passed by a plurality of third virtual lines together with the eleventh wirings, respectively;

a plurality of thirteenth wirings provided above the fourth wirings above the sixth region and above the fifth wirings above the seventh region, the thirteenth wirings overlapping the eleventh wirings, respectively, when viewed from the above, and the thirteenth wirings being provided so that a longitudinal direction of each of the thirteenth wirings is provided along the first direction;

a plurality of fourteenth wirings provided above the sixth wirings above the eighth region and above the seventh wirings above the ninth region, the fourteenth wirings overlapping the eleventh wirings and the twelfth wirings, respectively, when viewed from the above, the fourteenth wirings being passed by a plurality of fourth virtual lines together with the thirteenth wirings, respectively, and the fourteenth wirings being provided so that a longitudinal direction of each of the fourteenth wirings is provided along the first direction;

a plurality of first memory cells provided between the first wirings and the fourth wirings, respectively;

a plurality of second memory cells provided between the first wirings and the fifth wirings, respectively;

a plurality of third memory cells provided between the fifth wirings and the ninth wirings, respectively, and the third memory cells overlapping the second memory cells, respectively, when viewed from the above;

a plurality of fourth memory cells provided between the second wirings and the sixth wirings, respectively;

a plurality of fifth memory cells provided between the sixth wirings and the ninth wirings, respectively, and the fifth memory cells overlapping the fourth memory cells, respectively, when viewed from the above;

a plurality of sixth memory cells provided between the second wirings and the seventh wirings, respectively;

a plurality of seventh memory cells provided between the seventh wirings and the tenth wirings, respectively, and the seventh memory cells overlapping the sixth memory cells, respectively, when viewed from the above;

a plurality of eighth memory cells provided between the eighth wirings and the tenth wirings, respectively;

a plurality of ninth memory cells provided between the fourth wirings and the thirteenth wirings, respectively;

a plurality of tenth memory cells provided between the eleventh wirings and the fifth wirings, respectively;

a plurality of eleventh memory cells provided between the fifth wirings and the thirteenth wirings, respectively, and the eleventh memory cells overlapping the tenth memory cells, respectively, when viewed from the above;

a plurality of twelfth memory cells provided between the eleventh wirings and the sixth wirings, respectively;

a plurality of thirteenth memory cells provided between the sixth wirings and the fourteenth wirings, respectively, and the thirteenth memory cells overlapping the twelfth memory cells, respectively, when viewed from the above;

a plurality of fourteenth memory cells provided between the twelfth wirings and the seventh wirings, respectively;

a plurality of fifteenth memory cells provided between the seventh wirings and the fourteenth wirings, respectively, and the fifteenth memory cells overlapping the fourteenth memory cells, respectively, when viewed from the above;

a plurality of sixteenth memory cells provided between the twelfth wirings and the eighth wirings, respectively;

a first multiplexer provided on the substrate under the first wirings, and the first multiplexer being connected to the first wirings;

a second multiplexer provided on the substrate under the ninth wirings, and the second multiplexer being connected to the ninth wirings;

a third multiplexer provided on the substrate under the second wirings, and the third multiplexer being connected to the second wirings;

a fourth multiplexer provided on the substrate under the tenth wirings, and the fourth multiplexer being connected to the tenth wirings;

a fifth multiplexer connected to the fourth wirings and provided on the substrate;

a sixth multiplexer connected to the fifth wirings and provided on the substrate;

a seventh multiplexer connected to the sixth wirings and provided on the substrate;

an eighth multiplexer connected to the seventh wirings and provided on the substrate;

a ninth multiplexer connected to the eighth wirings and provided on the substrate;

a tenth multiplexer connected to the first, second, third and fourth multiplexers;

an eleventh multiplexer provided on the substrate under the thirteenth wirings, and the eleventh multiplexer being connected to the thirteenth wirings;

a twelfth multiplexer provided on the substrate under the eleventh wirings, and the twelfth multiplexer being connected to the eleventh wirings;

a thirteenth multiplexer provided on the substrate under the fourteenth wirings, and the thirteenth multiplexer being connected to the fourteenth wirings;

a fourteenth multiplexer provided on the substrate under the twelfth wirings, and the fourteenth multiplexer being connected to the twelfth wirings;

a fifteenth multiplexer connected to the eleventh, twelfth, thirteenth, and fourteenth multiplexers;

a first reading circuit connected to the tenth and fifteenth multiplexers; and a second reading circuit connected to the tenth and fifteenth multiplexers, wherein the first reading circuit and the second reading circuit:

perform first reading from the first memory cell and second reading from the ninth memory cell by using the first, fifth, and eleventh multiplexers, perform the first reading from the second memory cell and the second reading from the eleventh memory cell by using the first, sixth, and eleventh multiplexers, perform the first reading from the third memory cell and the second reading from the tenth memory cell by using the second, sixth, and twelfth multiplexers, perform the first reading from the fifth memory cell and the second reading from the twelfth memory cell by using the second, seventh, and twelfth multiplexers, perform the first reading from the fourth memory cell and the second reading from the thirteenth memory cell by using the third, seventh, and thirteenth multiplexers, perform the first reading from the sixth memory cell and the second reading from the fifteenth memory cell by using the third, eighth, and thirteenth multiplexers, perform the first reading from the seventh memory cell and the second reading from the fourteenth memory cell by using the fourth, eighth, and fourteenth multiplexers, or perform the first reading from the eighth memory cell and the second reading from the sixteenth memory cell by using the fourth, ninth, and fourteenth multiplexers.

10. The semiconductor storage device according to claim 9, wherein, when the first reading circuit performs the first reading, the second reading circuit performs the second reading, and wherein, when the first reading circuit performs the second reading, the second reading circuit performs the first reading.

* * * * *